(12) United States Patent
Ni et al.

(10) Patent No.: US 7,740,493 B2
(45) Date of Patent: Jun. 22, 2010

(54) UNIVERSAL SERIAL BUS (USB) FLASH DRIVE HOUSING A SLIM USB DEVICE AND HAVING SWIVEL CAP FUNCTIONALITIES ALLOWING FOR TWO LOCKING POSITIONS

(75) Inventors: Jim Chin-Nan Ni, San Jose, CA (US); David Nguyen, San Jose, CA (US); I-Kang Yu, Palo Alto, CA (US); Abraham Chih-Kang Ma, Fremont, CA (US)

(73) Assignee: SuperTalent Electronics, Inc., San Jose, CA (US)

( * ) Notice: Subject to any disclaimer, the term of this patent is extended or adjusted under 35 U.S.C. 154(b) by 0 days.

(21) Appl. No.: 11/874,108

(22) Filed: Oct. 17, 2007

(65) Prior Publication Data
US 2008/0261449 A1 Oct. 23, 2008

Related U.S. Application Data

(63) Continuation-in-part of application No. 11/309,847, filed on Oct. 12, 2006, now Pat. No. 7,507,119, and a continuation-in-part of application No. 11/466,759, filed on Aug. 23, 2006, which is a continuation-in-part of application No. 10/907,700, filed on Apr. 12, 2005, now Pat. No. 7,297,024, which is a continuation-in-part of application No. 10/789,333, filed on Feb. 26, 2004, now Pat. No. 7,318,117.

(51) Int. Cl.
*H01R 13/44* (2006.01)
(52) U.S. Cl. .................................................. 439/131
(58) Field of Classification Search ................ 439/607, 439/131, 133, 138, 147, 142, 148; 361/737, 361/752; 234/492, 488
See application file for complete search history.

(56) References Cited

U.S. PATENT DOCUMENTS

| | | | | |
|---|---|---|---|---|
| 6,676,420 | B1 * | 1/2004 | Liu et al. | 439/131 |
| 6,926,544 | B2 * | 8/2005 | Lee | 439/147 |
| 7,275,941 | B1 * | 10/2007 | Bushby | 439/133 |
| 7,295,431 | B2 * | 11/2007 | Chuang | 361/683 |
| 7,407,393 | B2 | 8/2008 | Ni et al. | |
| 7,420,803 | B2 | 9/2008 | Hsueh et al. | |
| 7,470,148 | B1 * | 12/2008 | Su et al. | 439/607 |
| 2002/0086581 | A1 * | 7/2002 | Chen et al. | 439/607 |
| 2005/0161513 | A1 * | 7/2005 | Huang et al. | 235/492 |

* cited by examiner

*Primary Examiner*—Alexander Gilman
(74) *Attorney, Agent, or Firm*—Maryam Imam; IPxLaw Group LLP

(57) ABSTRACT

A Universal Serial Bus (USB) flash drive includes a slim USB device having an end used to couple the USB flash drive to a host and an opposite end and a swivel cap having a side slit that serves as an opening into which the slim USB device travels horizontally, the side slit being disposed along a lateral side of the swivel cap. The USB flash drive also includes a USB device rivet placed into the slim USB device and the swivel cap to pivotally connect them at one of the ends of the slim USB device, so that the slim USB device is pivotally extendable outwardly from the side slit in a closed or open position. The swivel rocker is pivotally extendable outwardly from the opposite end of the slim USB device and when the swivel rocker is extended outwardly, the slim USB device is caused to extend outwardly.

20 Claims, 36 Drawing Sheets

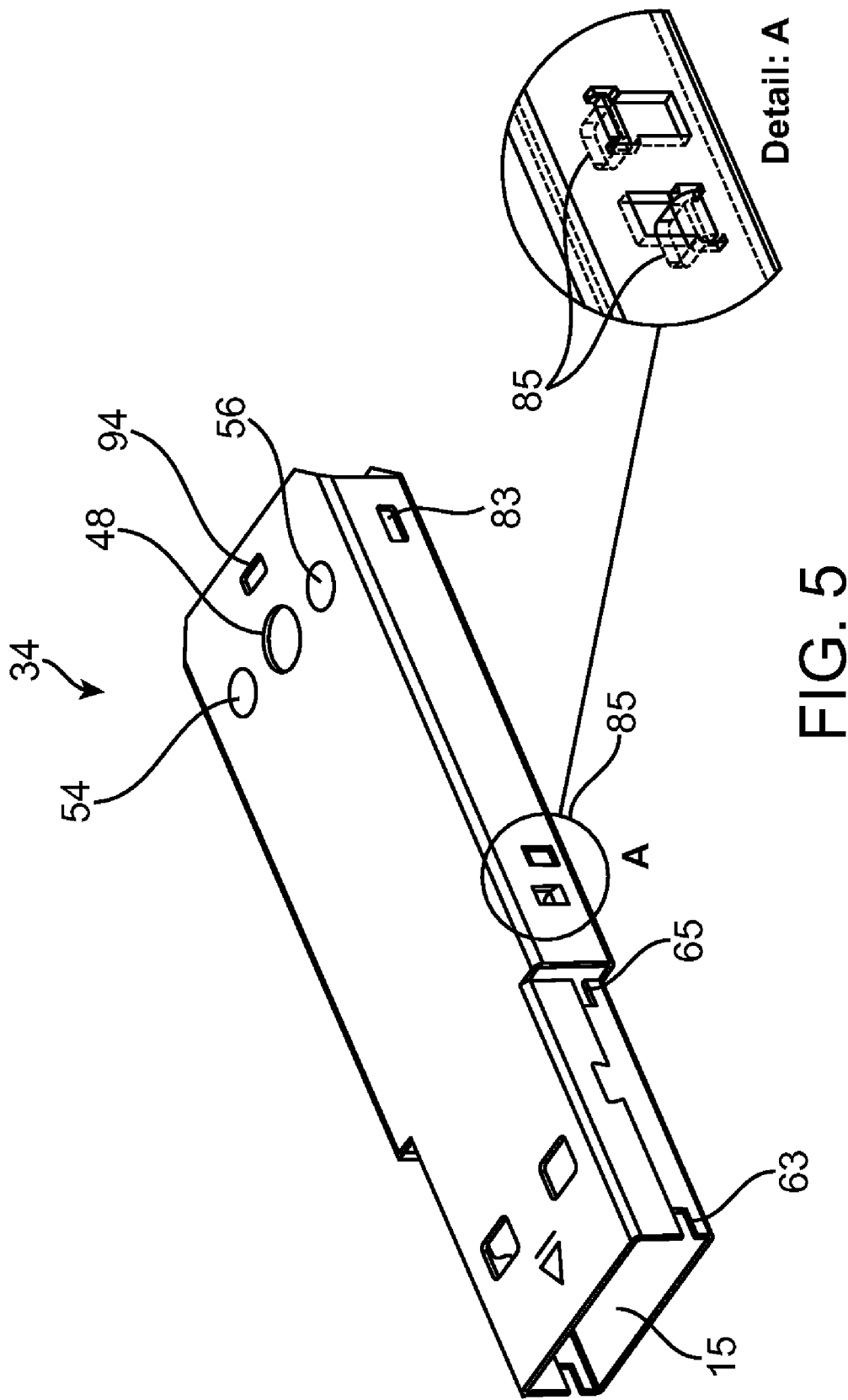

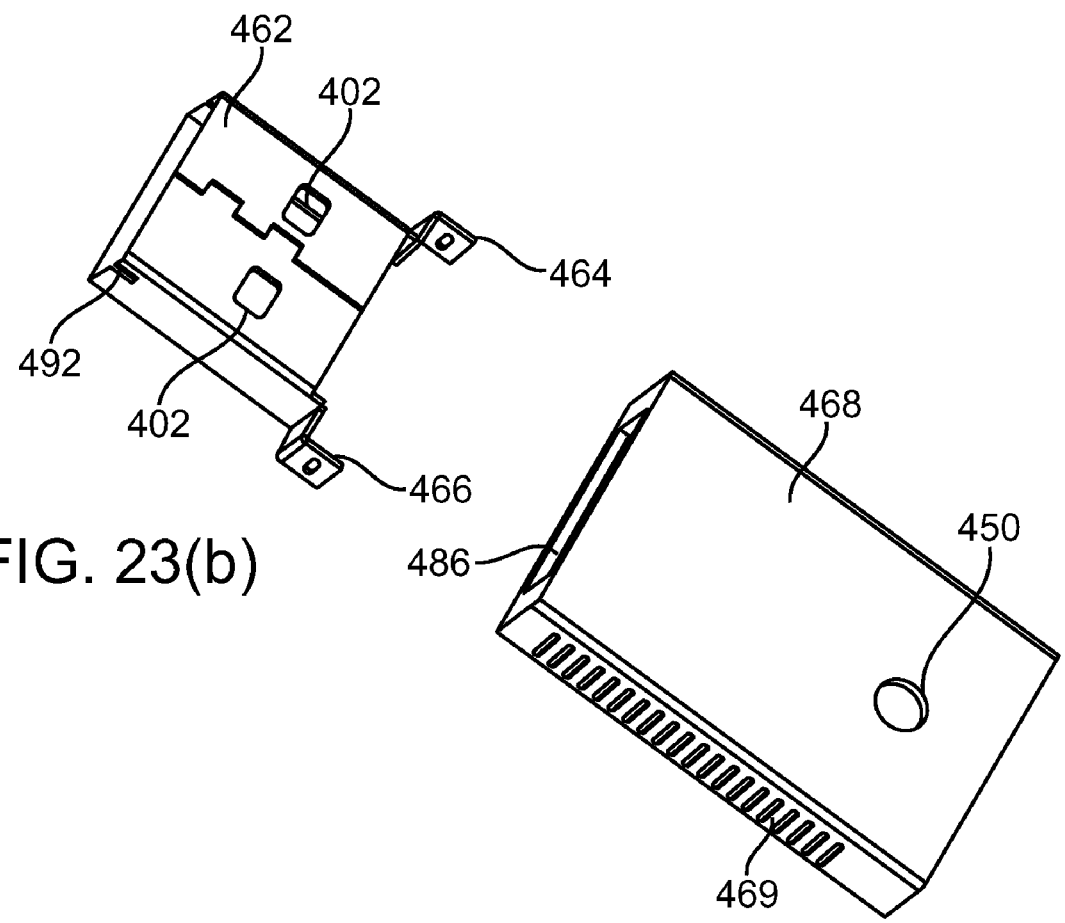
FIG. 23(b)
FIG. 23(a)
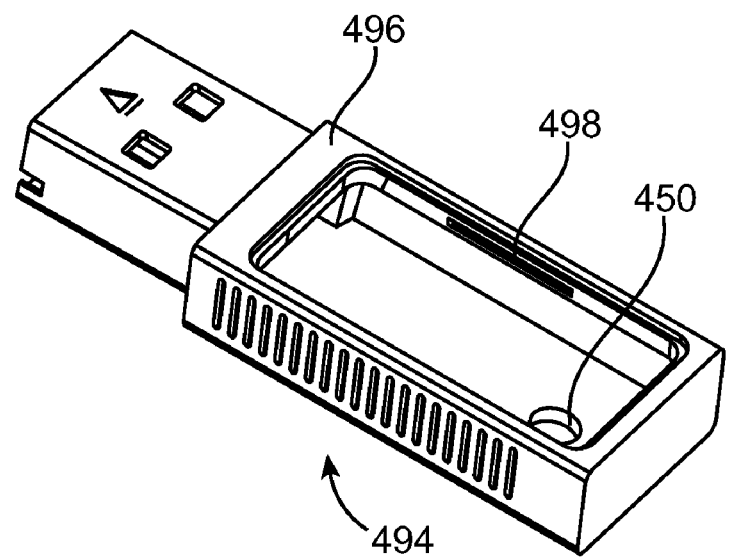
FIG. 23(c)

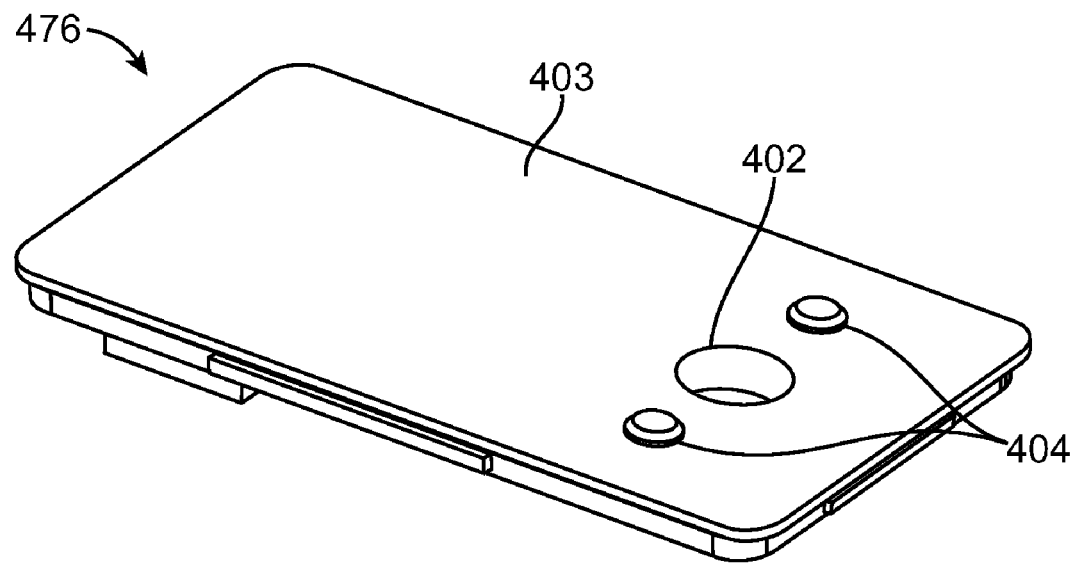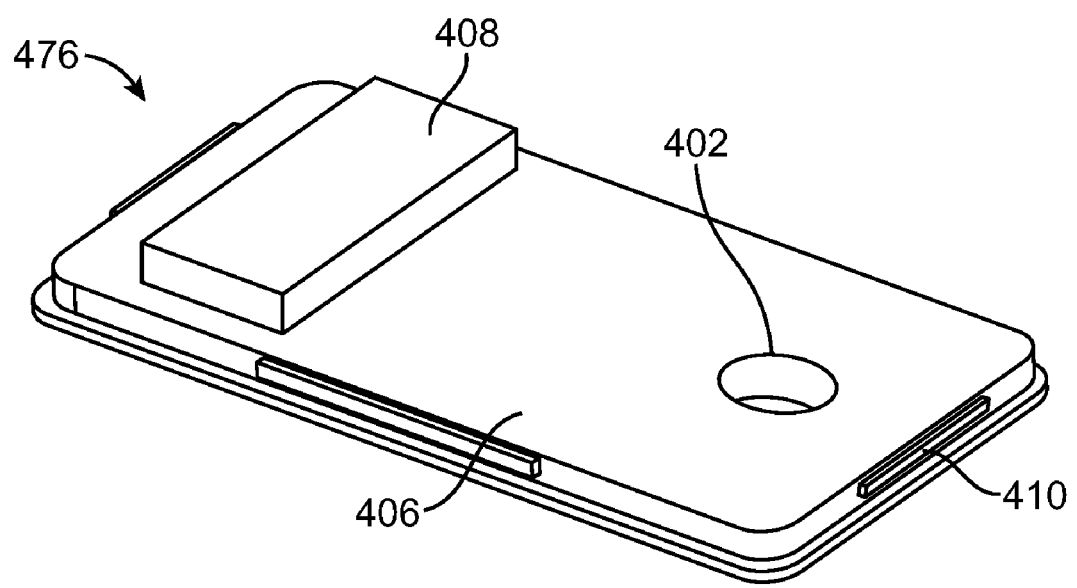
FIG. 24

UNIVERSAL SERIAL BUS (USB) FLASH DRIVE HOUSING A SLIM USB DEVICE AND HAVING SWIVEL CAP FUNCTIONALITIES ALLOWING FOR TWO LOCKING POSITIONS

CROSS REFERENCE TO RELATED APPLICATIONS

This application is a continuation-in-part (CIP) of U.S. patent application for "Universal-Serial-Bus (USB) Flash-Memory Device with Metal Wrap formed over Plastic Housing", U.S. application Ser. No. 10/907,700, filed Apr. 12, 2005. This application is also a continuation in part of U.S. patent application for "USB Device with Integrated USB Plug with USB Substrate Supporter Inside", U.S. application Ser. No. 11/309,847, filed Oct. 12, 2006. This application is also a continuation in part of U.S. patent application for "Flash Memory Controller for Electronic Data Flash Card", U.S. application Ser. No. 11/466,759, filed on Aug. 23, 2006, which is a CIP of "System and Method for Controlling Flash Memory", U.S. application Ser. No. 10/789,333, filed on Feb. 26, 2004.

BACKGROUND OF THE INVENTION

1. Field of the Invention

The present invention relates generally to the field of universal serial bus (USB) flash drives (or devices) and particularly to USB flash drives having an encapsulated and retractable USB device.

2. Description of the Prior Art

As computers have gained enormous popularity in recent decades, so has the need for better and more efficient ways of storing memory. Notable among memory devices are the portable ones that may be carried around by the user to access computers at different locations. This is particularly common in the case of personal computers (PC) where the need often arises to transfer data from one PC to another. Examples of portable memory devices include nonvolatile memory devices such as a universal serial bus (USB) flash drive that is removably connectable to a computer.

USB flash drives are available in various shapes and forms. The USB flash drive needs a USB plug connector to be coupled to a USB port of a host device such as a PC. The USB flash drive generally has a metal casing and a cover which is screwed in or otherwise attached to the casing. To access the USB plug connector, the user needs to open the metal cover and place it in the back on the casing after finishing the work with the USB flash drive. There is therefore the possibility of losing or misplacing the cover because it is completely detached when removed, from the USB plug connector. Furthermore, the possibility of leaving the USB plug connector without a cover is increased thereby adversely affecting the security of the connector.

The need therefore arises for a USB flash drive having a USB device that is secure and that uses a cap that is unlikely to be detached therefrom.

SUMMARY OF THE INVENTION

Briefly, an embodiment of the present invention includes a slim USB device having an end used to couple the USB flash drive to a host and an opposite end and a swivel cap having a side slit that serves as an opening into which the slim USB device travels horizontally, the side slit being disposed along a lateral side of the swivel cap. The USB flash drive also includes a USB device rivet placed into the slim USB device and the swivel cap to pivotally connect them at one of the ends of the slim USB device, so that the slim USB device is pivotally extendable outwardly from the side slit in a closed or open position. The swivel rocker is pivotally extendable outwardly from the opposite end of the slim USB device and when the swivel rocker is extended outwardly, the slim USB device is caused to extend outwardly.

The foregoing and other objects, features and advantages of the present invention will be apparent from the following detailed description of the preferred embodiments which make reference to several figures of the drawing.

IN THE DRAWINGS

FIG. 1(a) shows a universal serial bus (USB) flash drive USB flash drive 10 is shown to include a Slim USB device 12, Swivel rocker USB device opening 14, a swivel cap rivet 16, a label 18 and a swivel rocker 20, in accordance with an embodiment of the present invention.

FIG. 1(b) shows an angular perspective of the bottom side of the USB flash drive 10 more specifically showing the swivel cap side slit 22 into which the Slim USB device 12 moves when being closed is shown.

FIG. 1(c) shows a top view of the USB flash drive 10 with the swivel rocker 20 and the Slim USB device 12 extended outwardly or in an open position.

FIG. 1(d) shows an angular perspective of the top side of the USB flash drive 10 with the swivel rocker 20 and the Slim USB device 12 shown in open position.

Figure 5B:
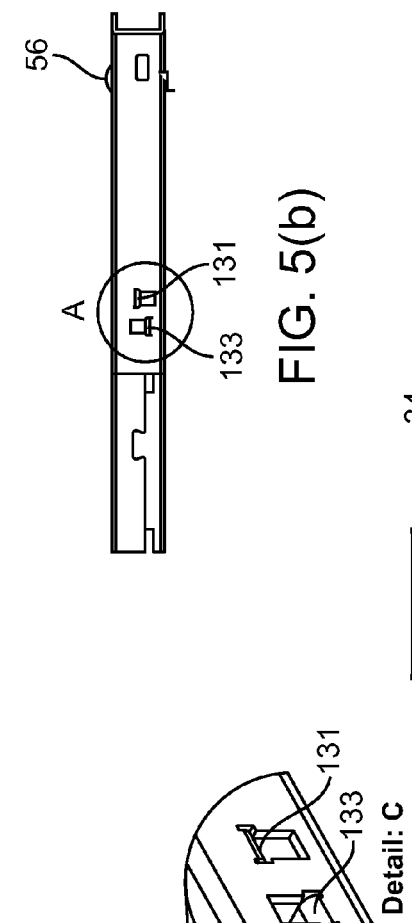
FIG. 5 shows a top and side angular view of the metal case 34 to show its relevant components in greater detail.
Figure 5E:
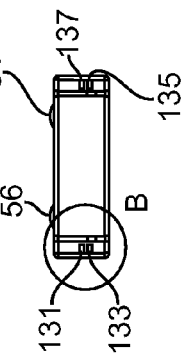
Figure 5D:
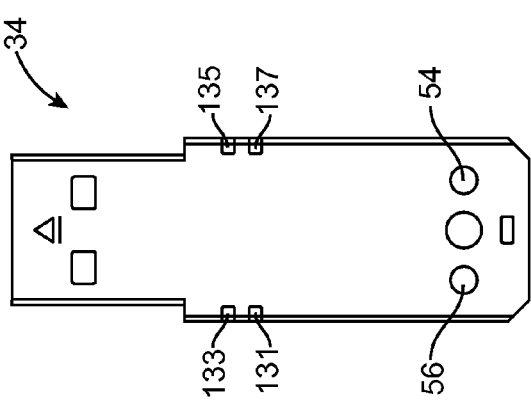
Figure 5A:
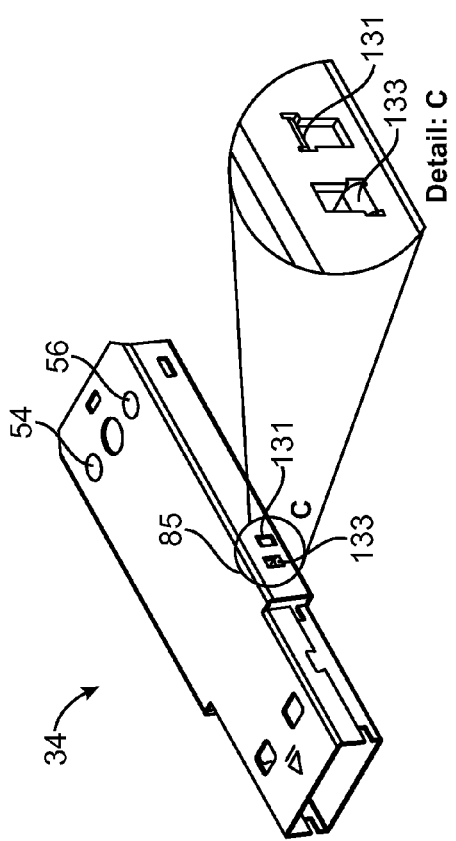

FIG. 5(a) shows the metal case 34 with a closer view of the USB device tabs 85, which is shown to include a metal case upper tab 131 and a metal case lower tab 133, in accordance with an embodiment of the present invention.

FIG. 5(b) shows a side view of the metal case upper tab 131 and metal case lower tab 133, in accordance with an alternative embodiment of the present invention.

Figure 5C:
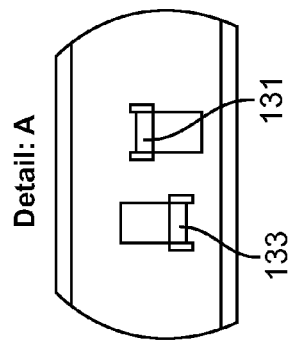

FIG. 5(c) shows a closer side view of the metal case upper tab 131 and metal case lower tab 133.

FIG. 5(d) shows the top side of the metal case metal case 34, which includes the two sets of USB device tabs 85 with one set disposed on the left side of the metal case metal case 34 being the metal case upper tab 131 and metal case lower tab 133 and another set, located in a like place along the side of the metal case 34 as that of the metal case upper tab 131 and metal case lower tab 133, as the metal case lower tab 135 and metal case upper tab 137.

FIG. 5(e) shows the inside of top and inside of the metal case 34 where the metal case upper tab 137, metal case lower tab 135, metal case upper tab 131 and metal case lower tab 133 are located.

Figure 6:
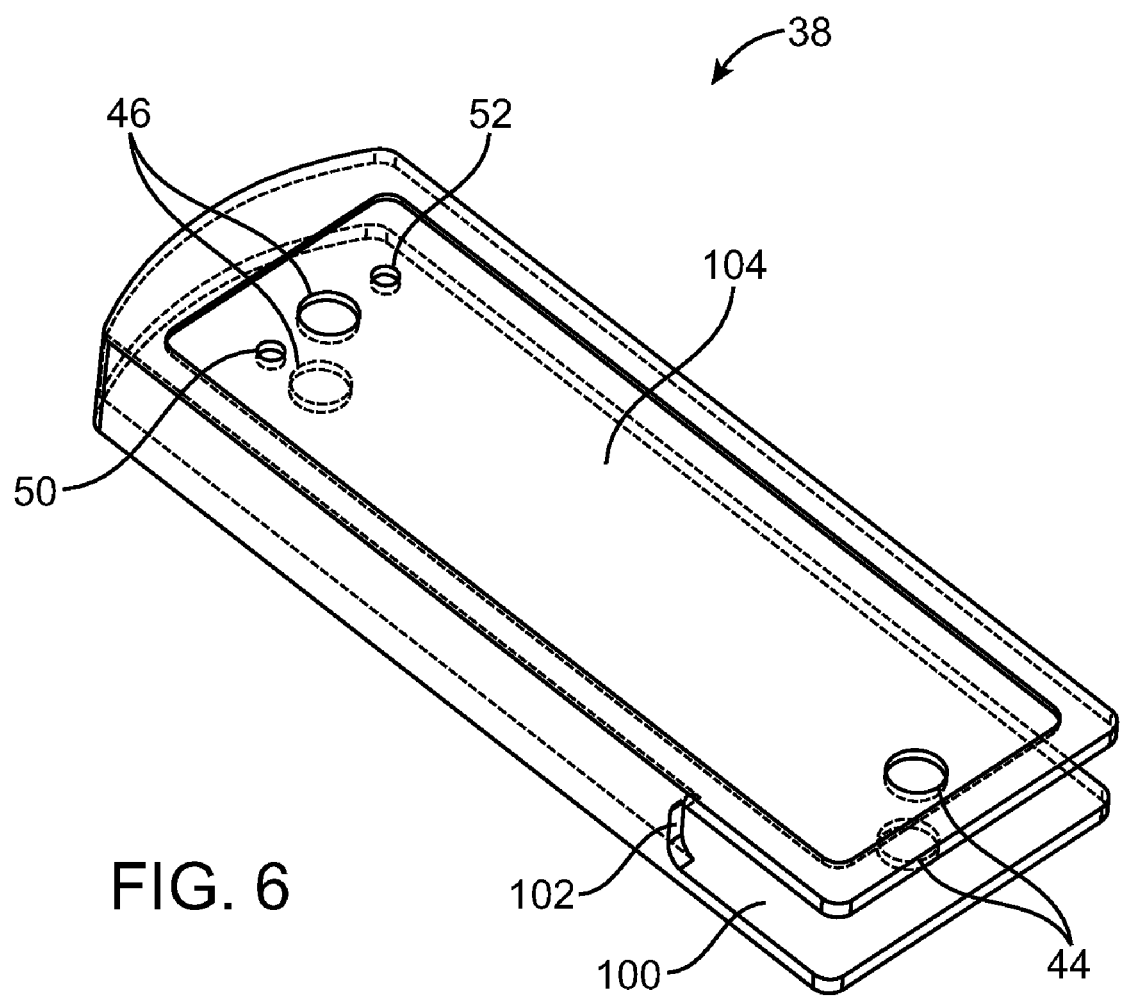

FIG. 6 shows greater details of a top and side angular view of the USB device swivel cap 38, in accordance with an embodiment of the present invention.

Figure 7:
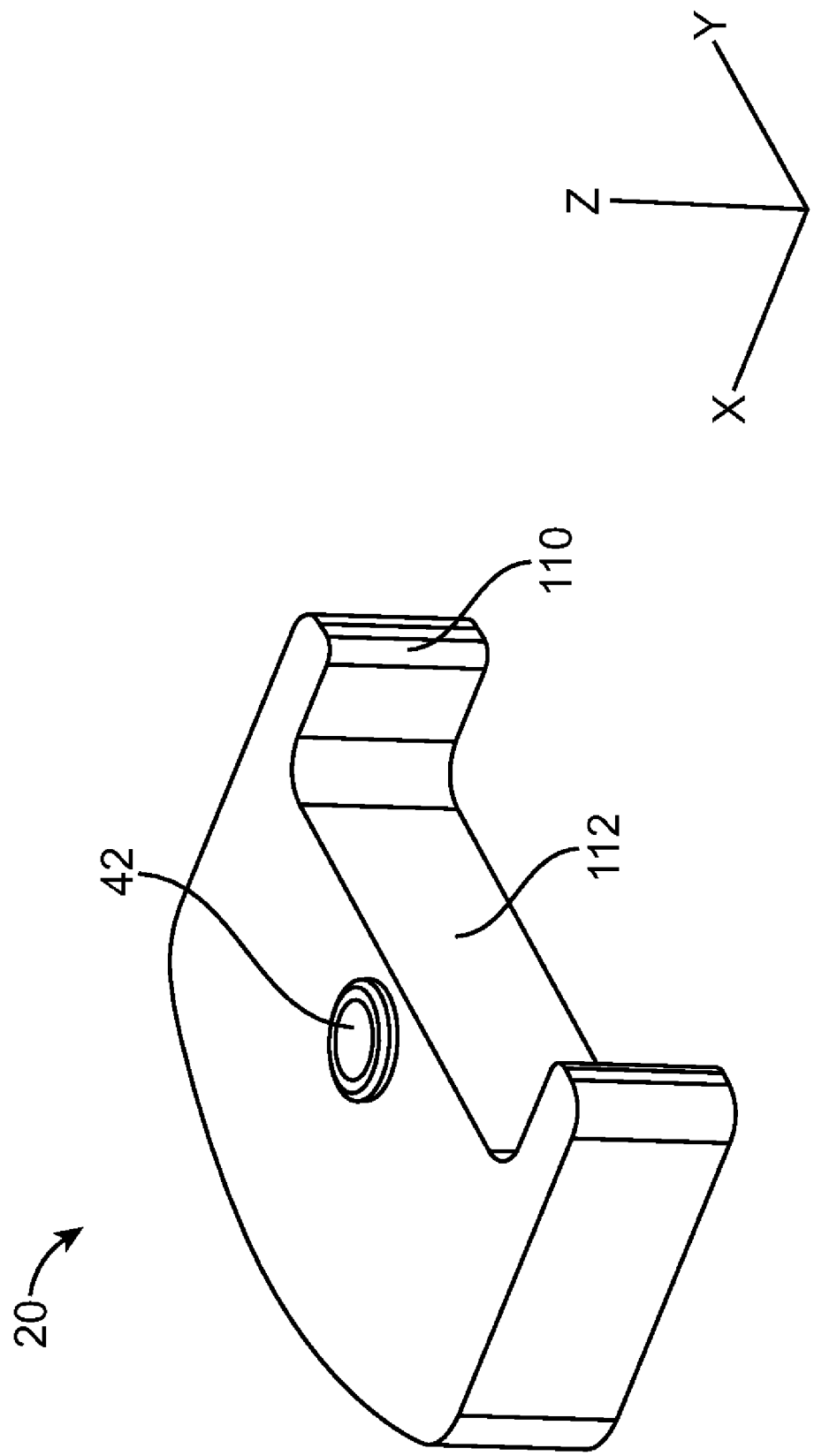

FIG. 7 shows further details, at a top and side angular view, of the swivel rocker 20, in accordance with an embodiment of the present invention.

Figure 8:
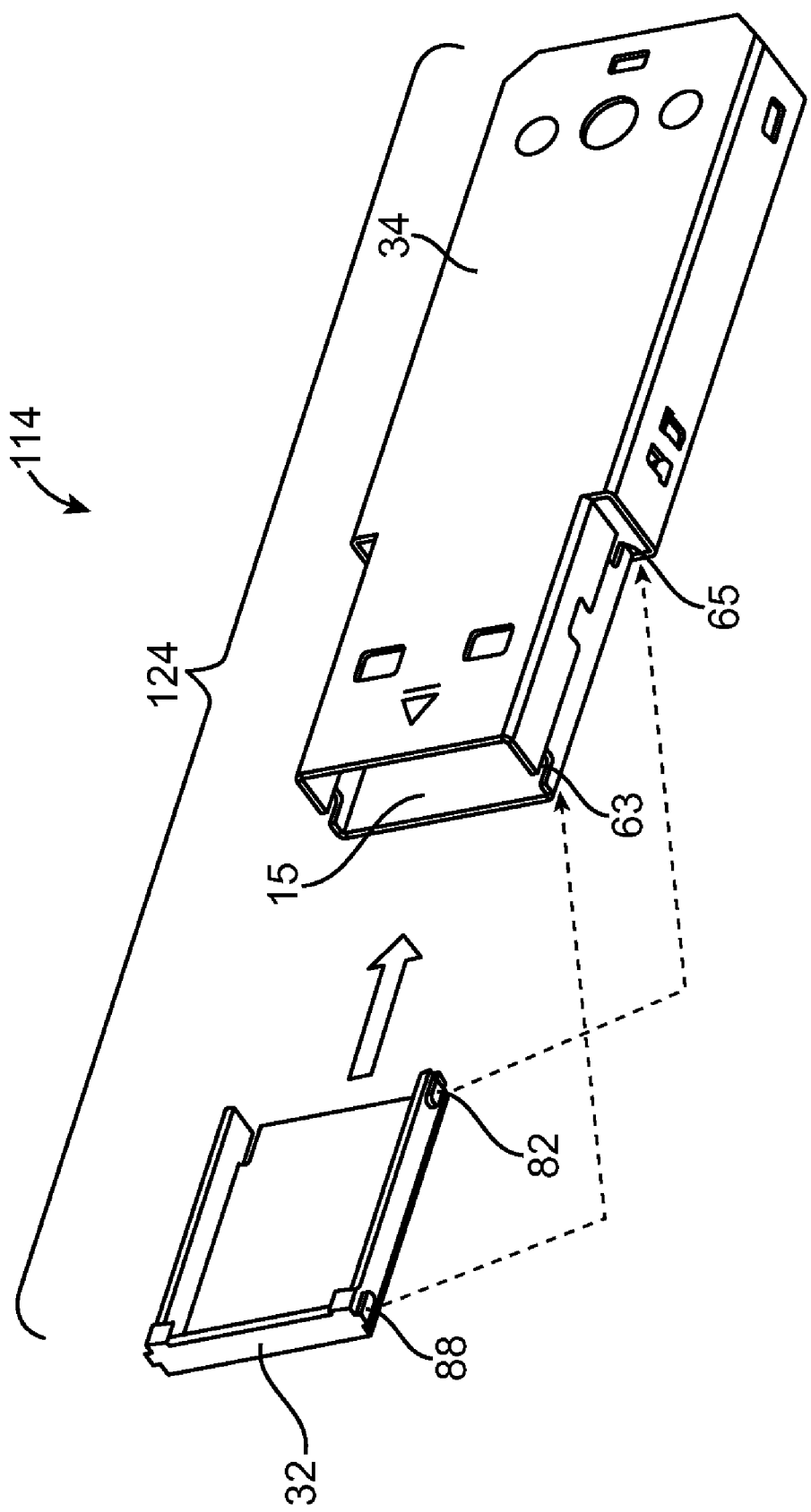

FIG. 8 shows a step used to manufacture the USB flash drive 10, in accordance with a method of the present invention. In FIG. 8, at step 114, the PCB support 32 is positioned into the metal case 34 by pressing the PCB support 32 into the metal case 34 until the PCB tab 82 of the PCB support 32 snap into the metal case back slot 65 of the metal case 34 and the PCB tab 88 of the PCB support 32 snap into the metal case front slot 63 of the PCB support 32.

Figure 9:
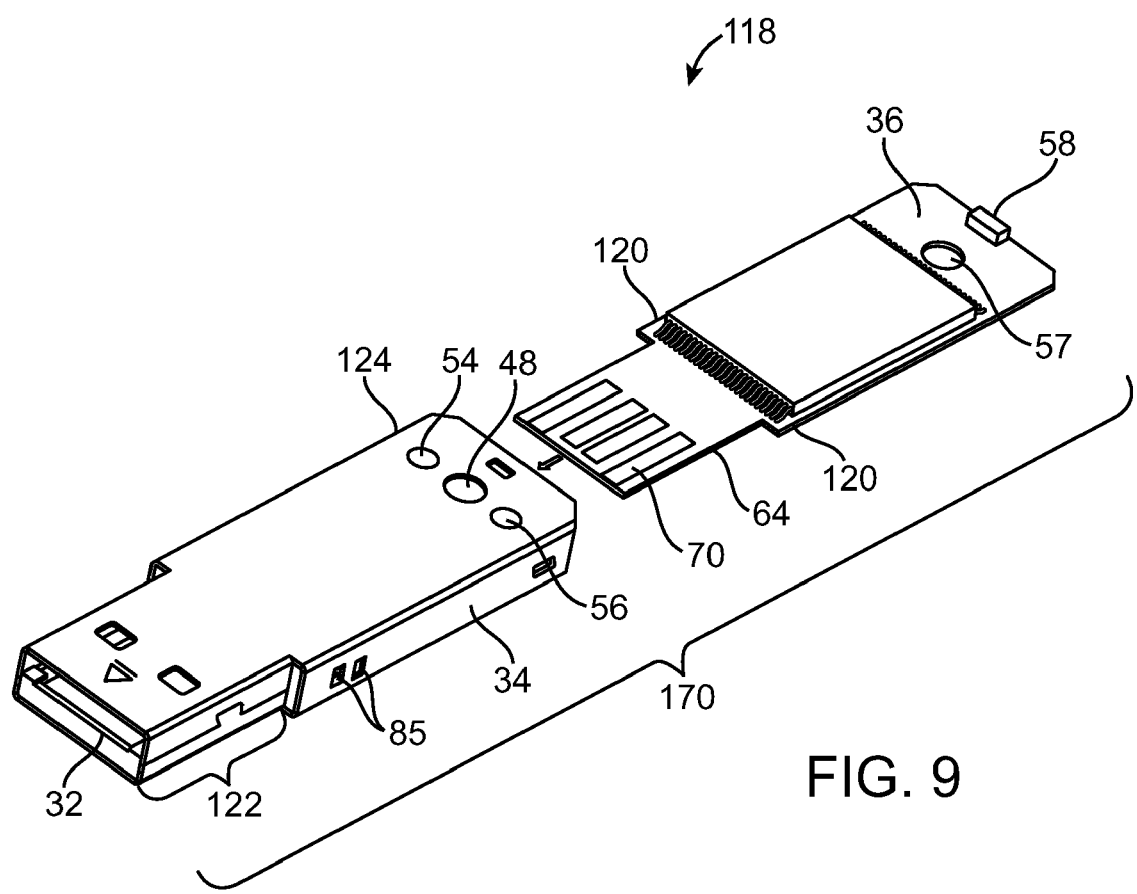

FIG. 9 shows a step used to manufacture the USB flash drive 10, in accordance with a method of the present invention. At step 118 of FIG. 9, the PCBA 36 is placed into the metal case sub-assembly 124 formed in FIG. 8.

Figure 10:
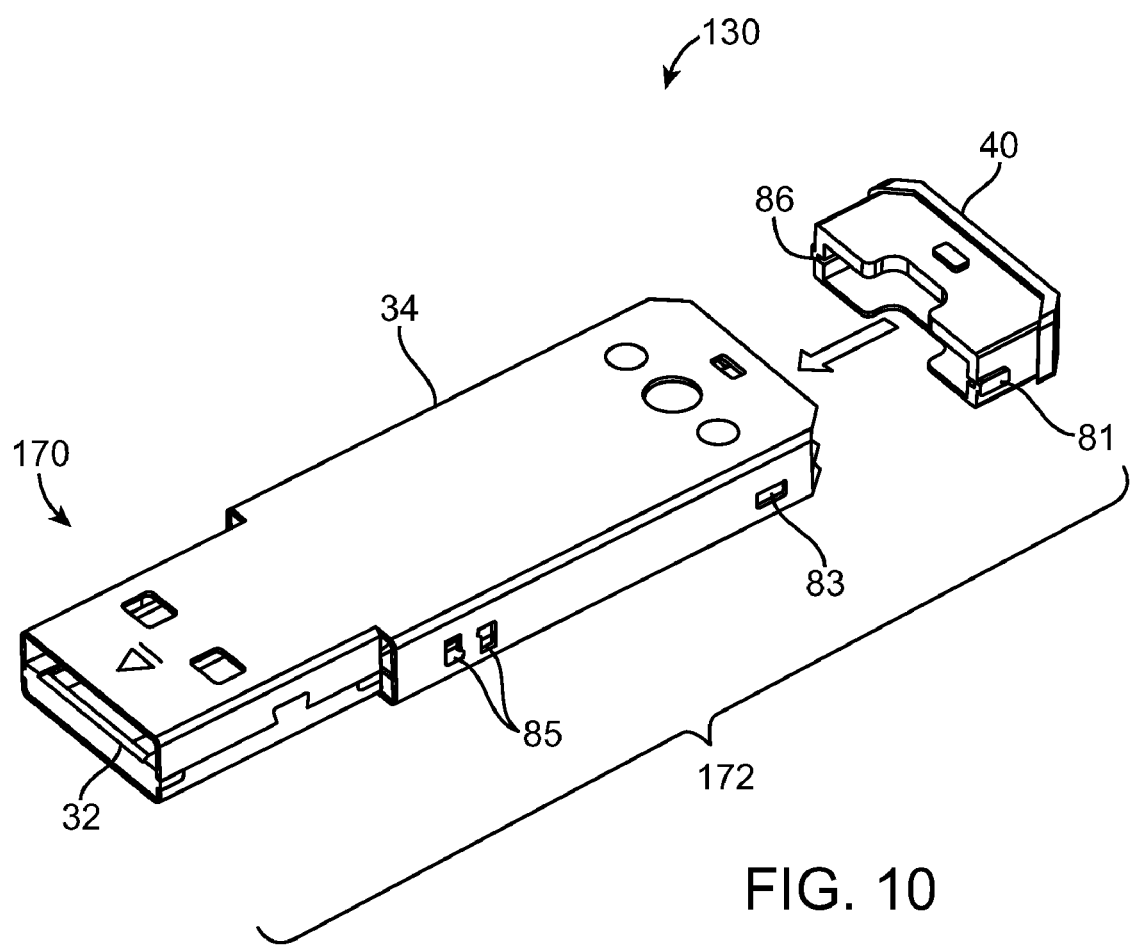

FIG. 10 shows a step used to manufacture the USB flash drive 10, in accordance with a method of the present invention. In FIG. 10, at step 130, the end cap 40 is pressed into the metal case 34, which is a part of the PCBA sub-assembly 170, in accordance with an embodiment of the present invention.

Figure 11:
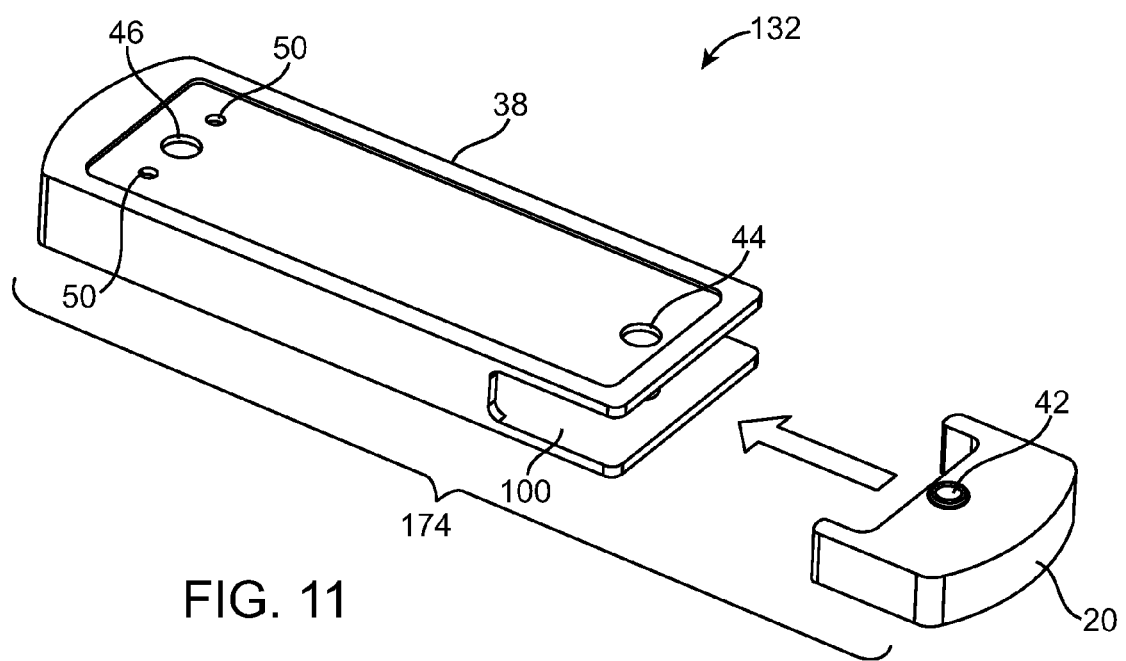

FIG. 11 shows a step used to manufacture the USB flash drive 10, in accordance with a method of the present invention. In FIG. 11, at step 132, the swivel rocker 20 is pressed into the USB device swivel cap 38.

Figure 12:
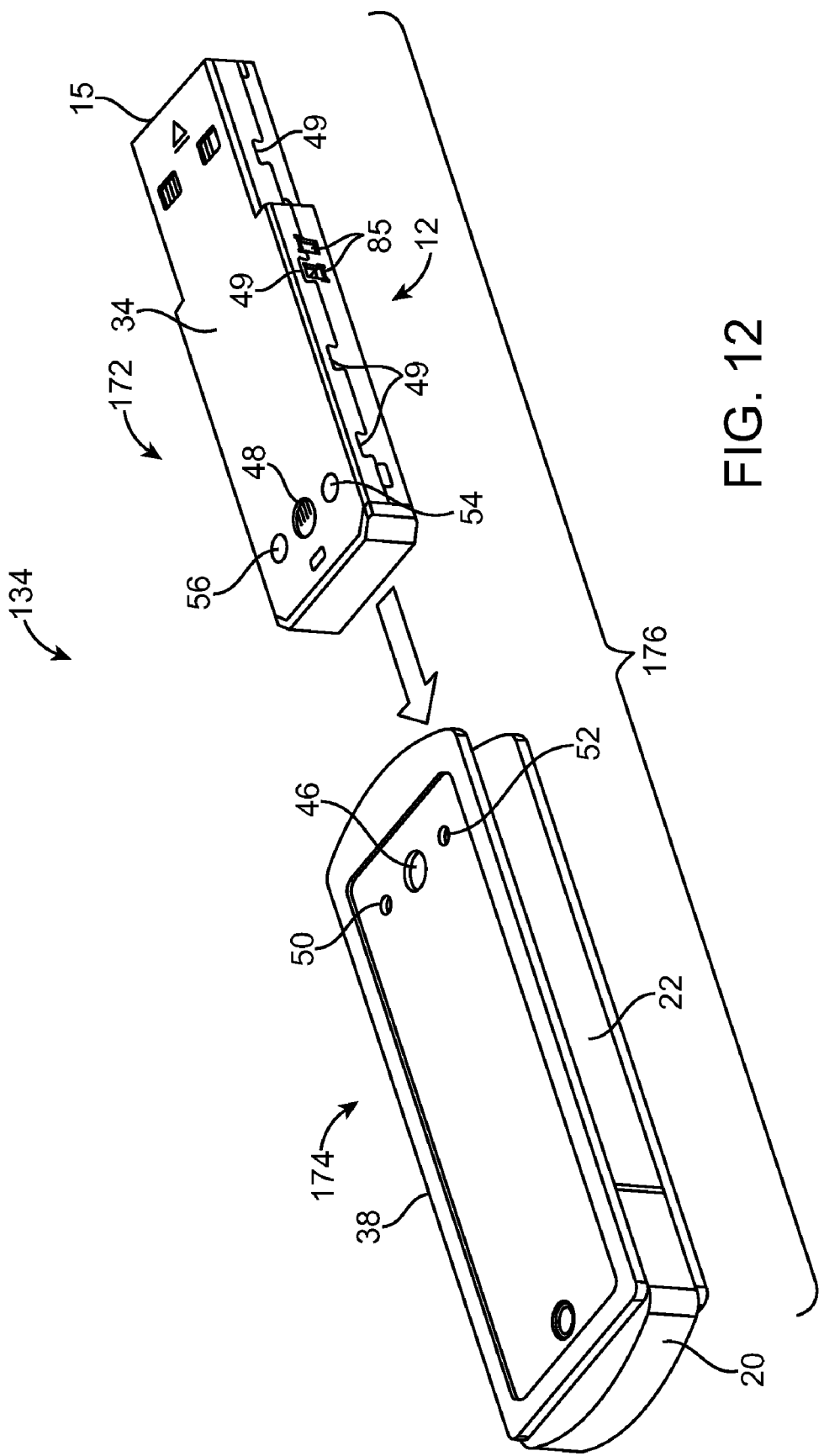

FIG. 12 shows a step used to manufacture the USB flash drive 10, in accordance with a method of the present invention. In FIG. 12, at step 134, the metal case and end cap sub-assembly 172 is pressed into the swivel cap sub-assembly 174, at an end of the swivel cap sub-assembly 174 that is in opposite to the swivel rocker 20, until the USB device protrusion 54 and USB device protrusion 56 of the metal case 34 snap into the cap hole 52 and cap hole 50 of the USB device swivel cap 38, respectively, to form the 178.

Figure 13:
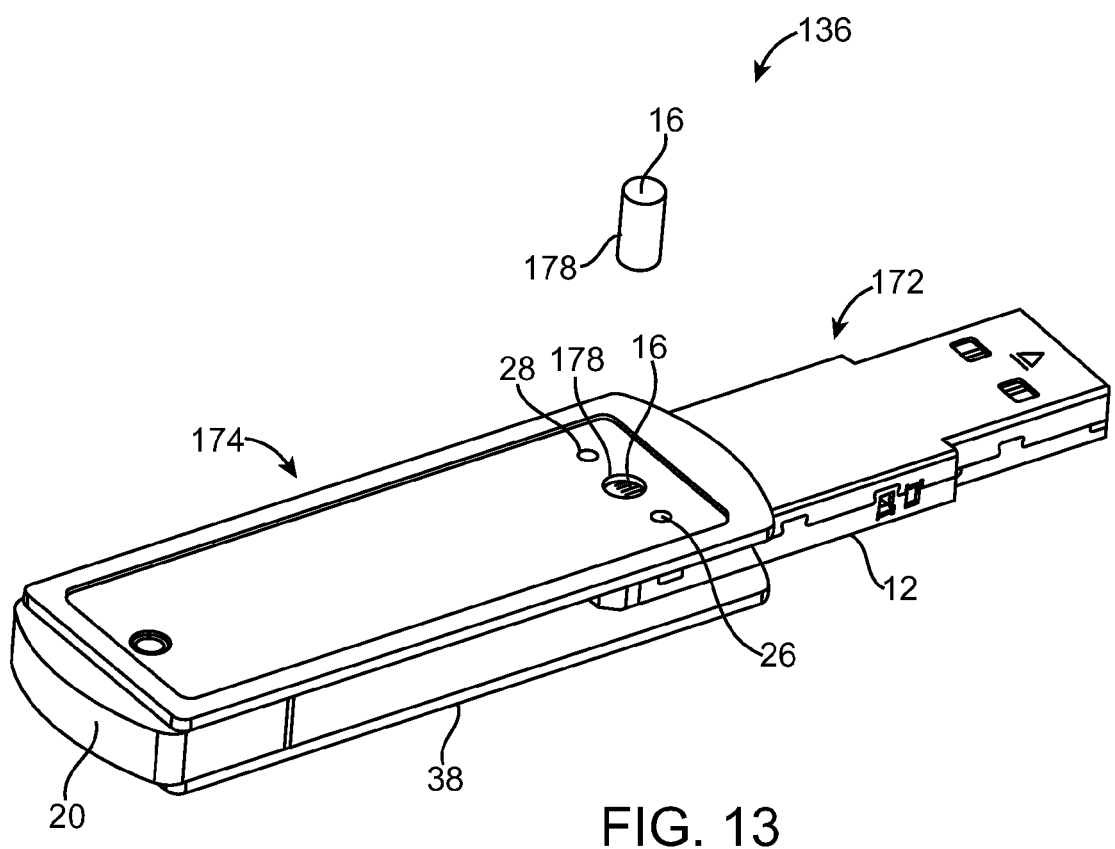

FIG. 13 shows a step used to manufacture the USB flash drive 10, in accordance with a method of the present invention. In FIG. 13, at step 136, the USB device Rivet 16 is pressed through the USB device Rivet 16 of the USB device swivel cap 38 and there through to pivotally connect the metal case and end cap sub-assembly 172 to the swivel cap sub-assembly 174.

Figure 14:
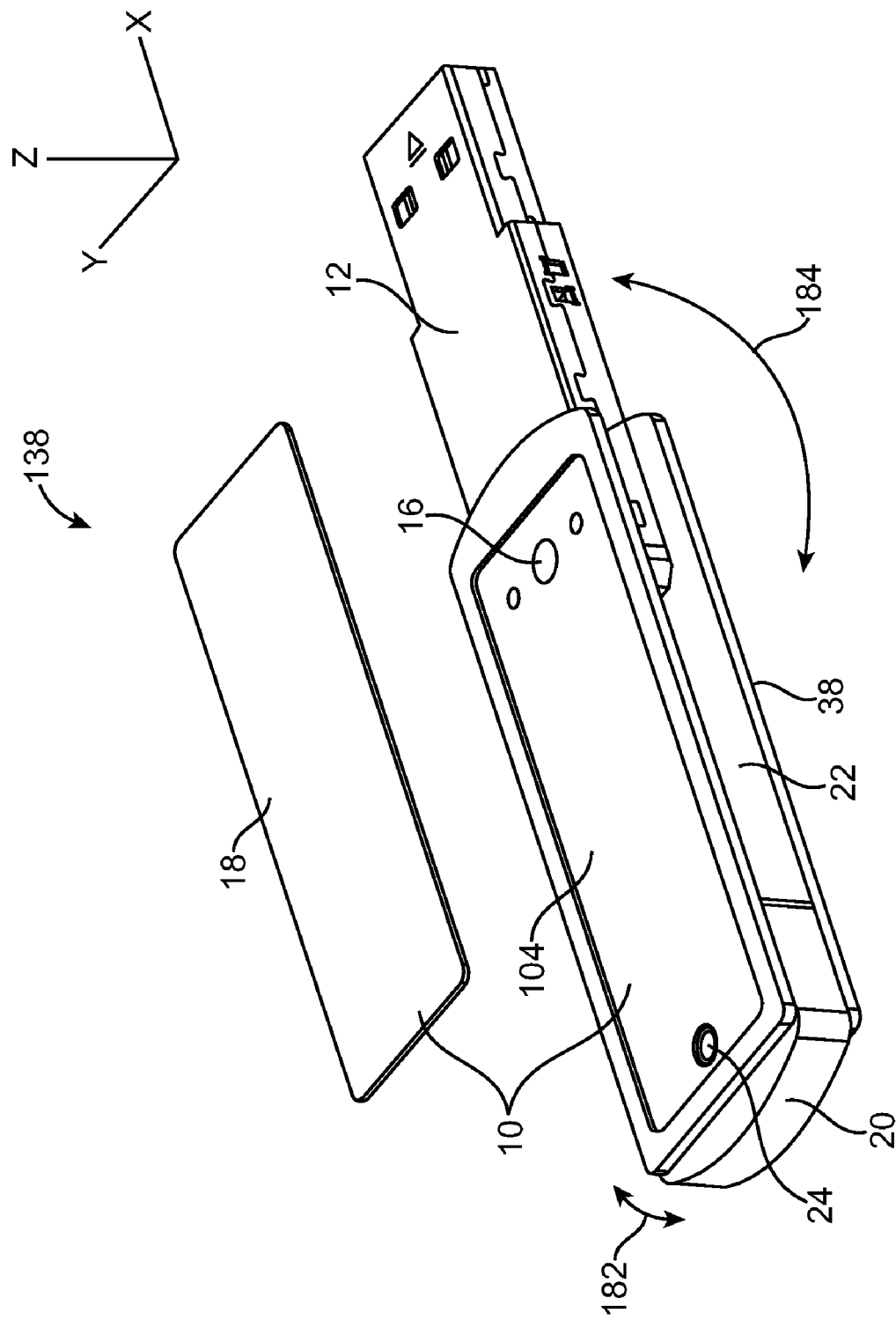

FIG. 14 shows a step used to manufacture the USB flash drive 10, in accordance with a method of the present invention. In FIG. 14, at step 138, the Label 18 is placed onto the USB flash drive swivel cap recessed top side 104 of the USB device swivel cap 38 to form the USB flash drive 10.

Figure 15:
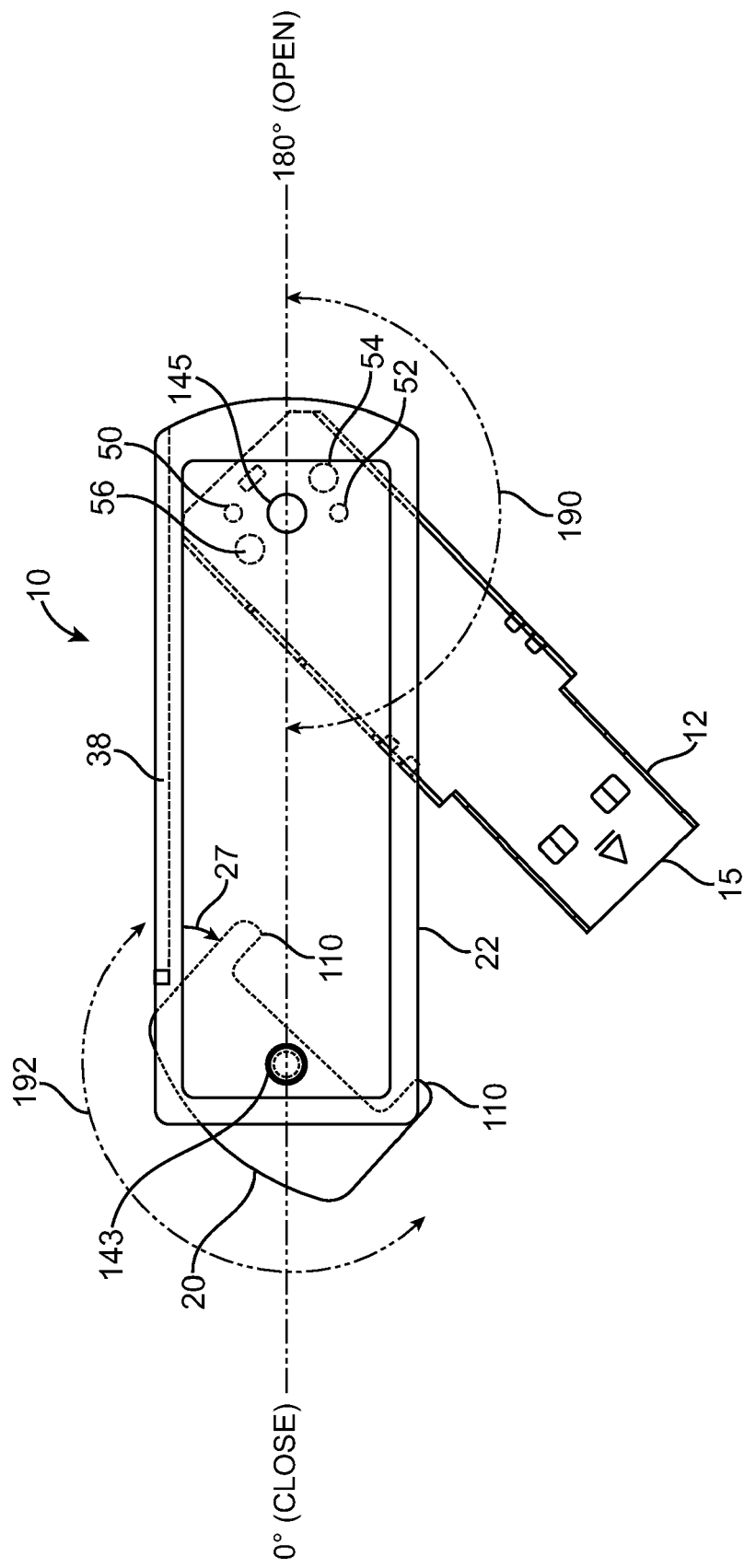

FIG. 15 shows the USB flash drive 10 with the Slim USB device 12 being opened and traveling in a direction shown by the arrow 190.

Figure 16:
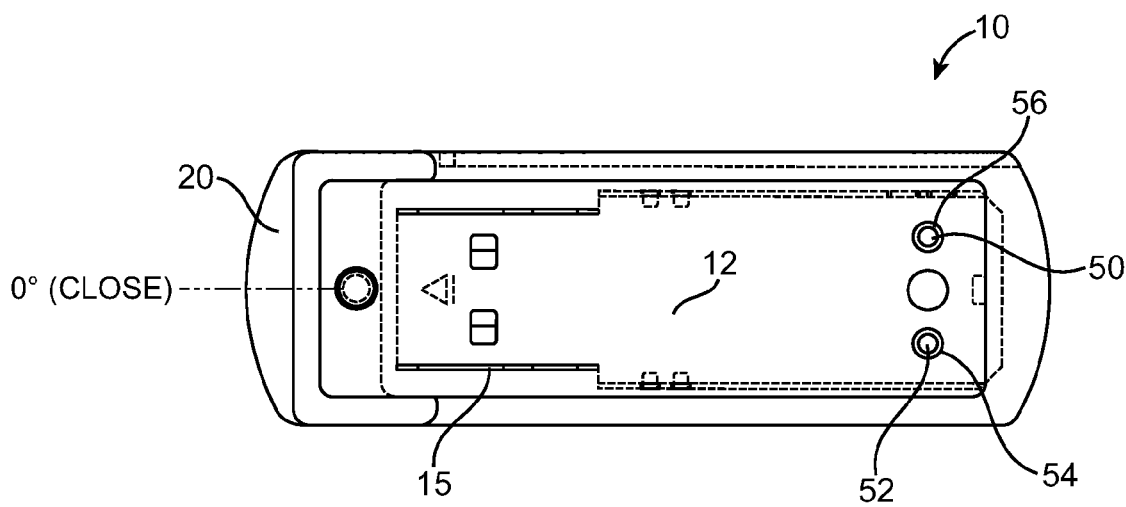

FIG. 16 shows the USB flash drive 10 where the Slim USB device 12 and the swivel rocker 20 are at a closed position and completed inside of the USB flash drive 10.

Figure 16A:
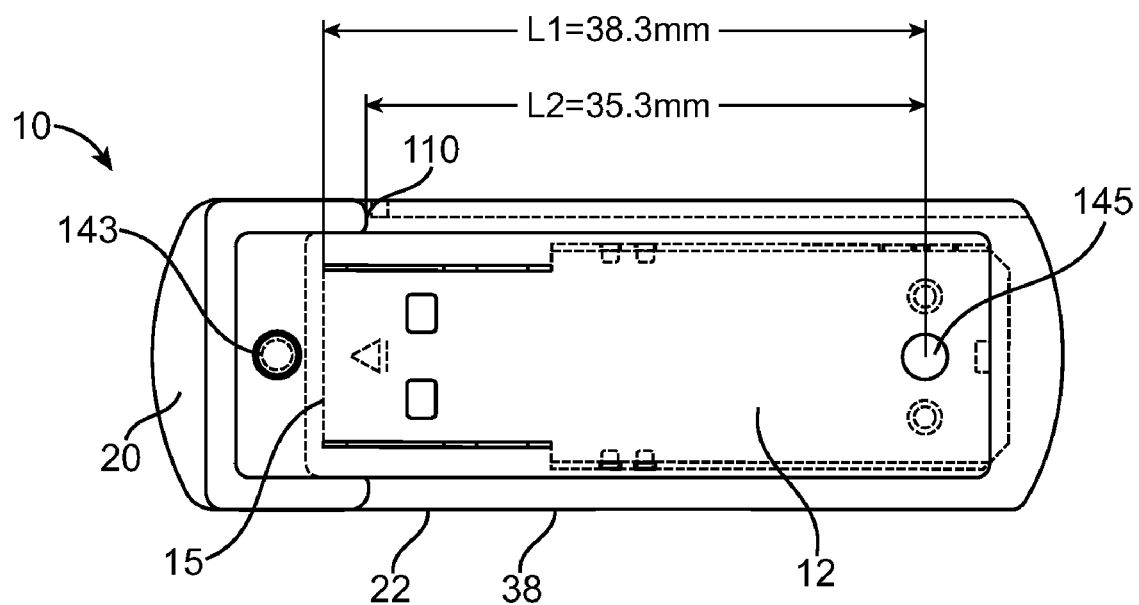

FIG. 16(a) shows exemplary dimensions of the USB flash drive 10.

Figure 17:
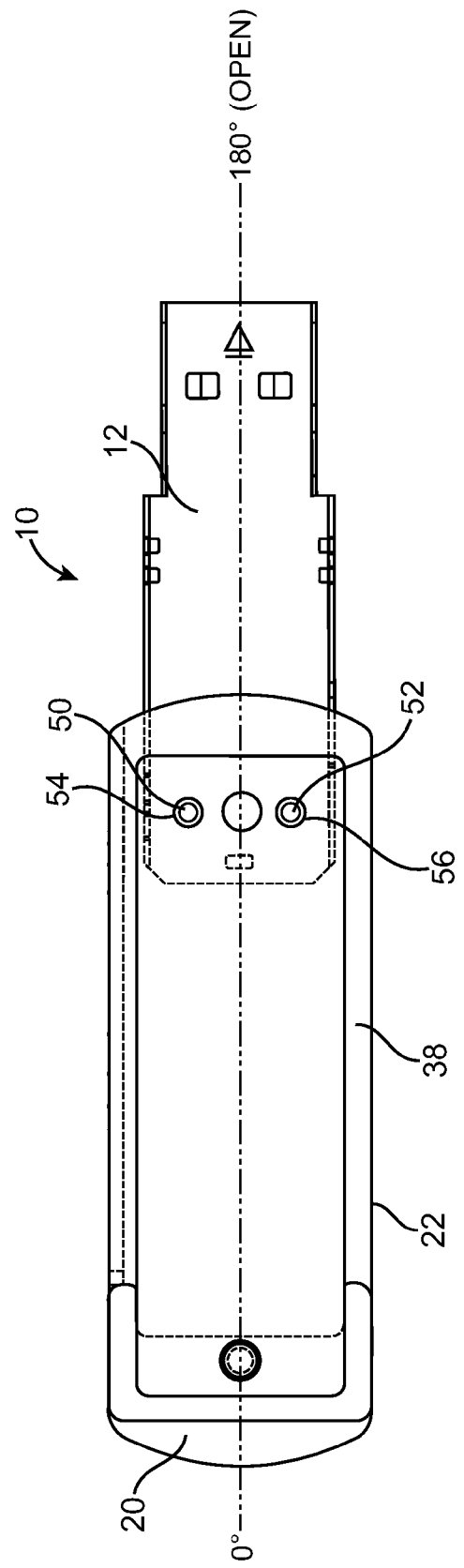

FIG. 17 shows the USB flash drive 10 where the Slim USB device 12 in shown to be in an open position while the swivel rocker 20 is shown to be in a closed position.

Figure 18:
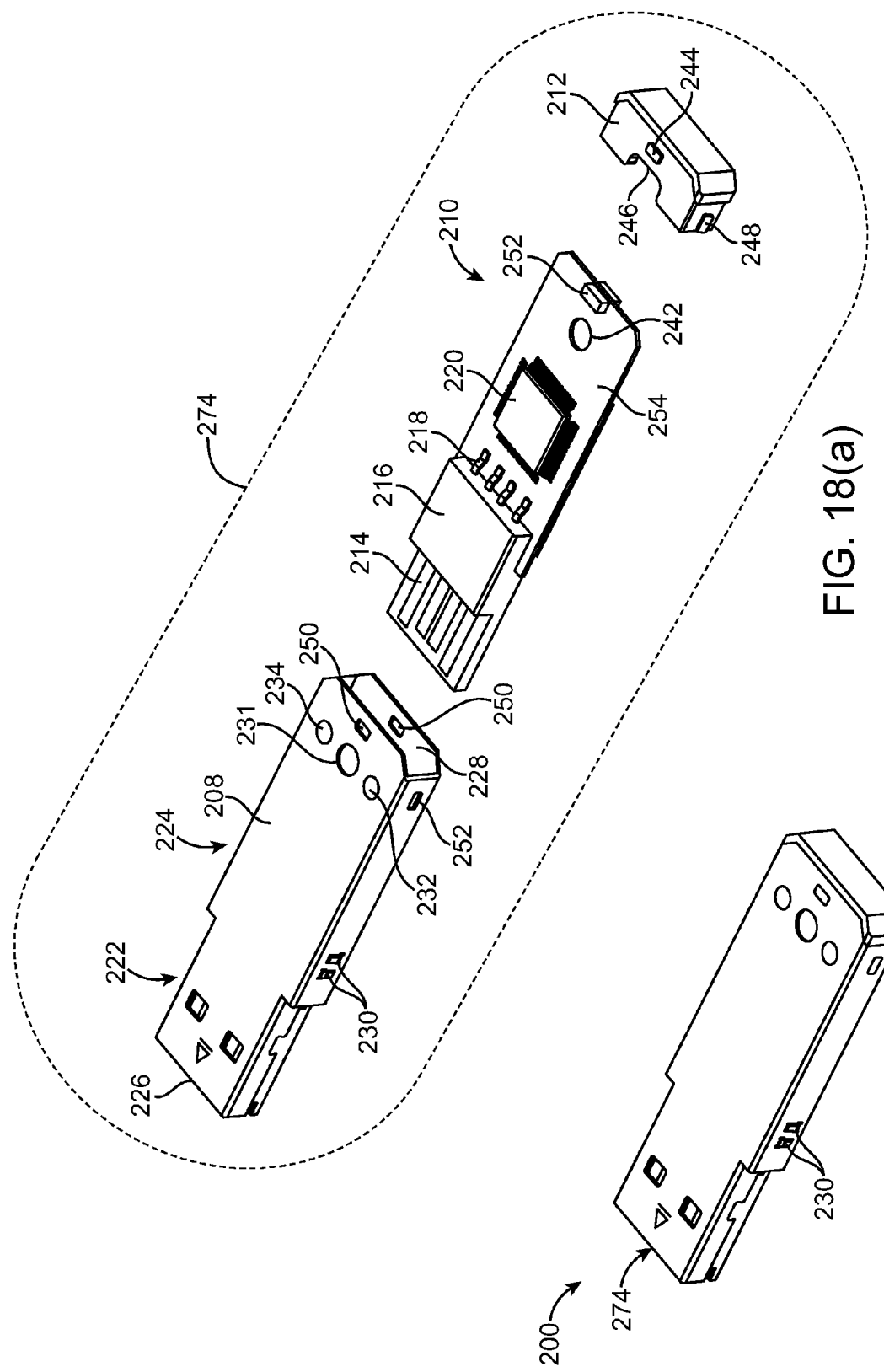

FIG. 18 shows a top and side angular view of a USB flash drive 200 to include a slim USB device 274, which includes a swivel rocker USB device opening 14, in accordance with another embodiment of the present invention.

FIG. 18(a) shows a view of the disassembled slim USB device 274.

Figure 19:
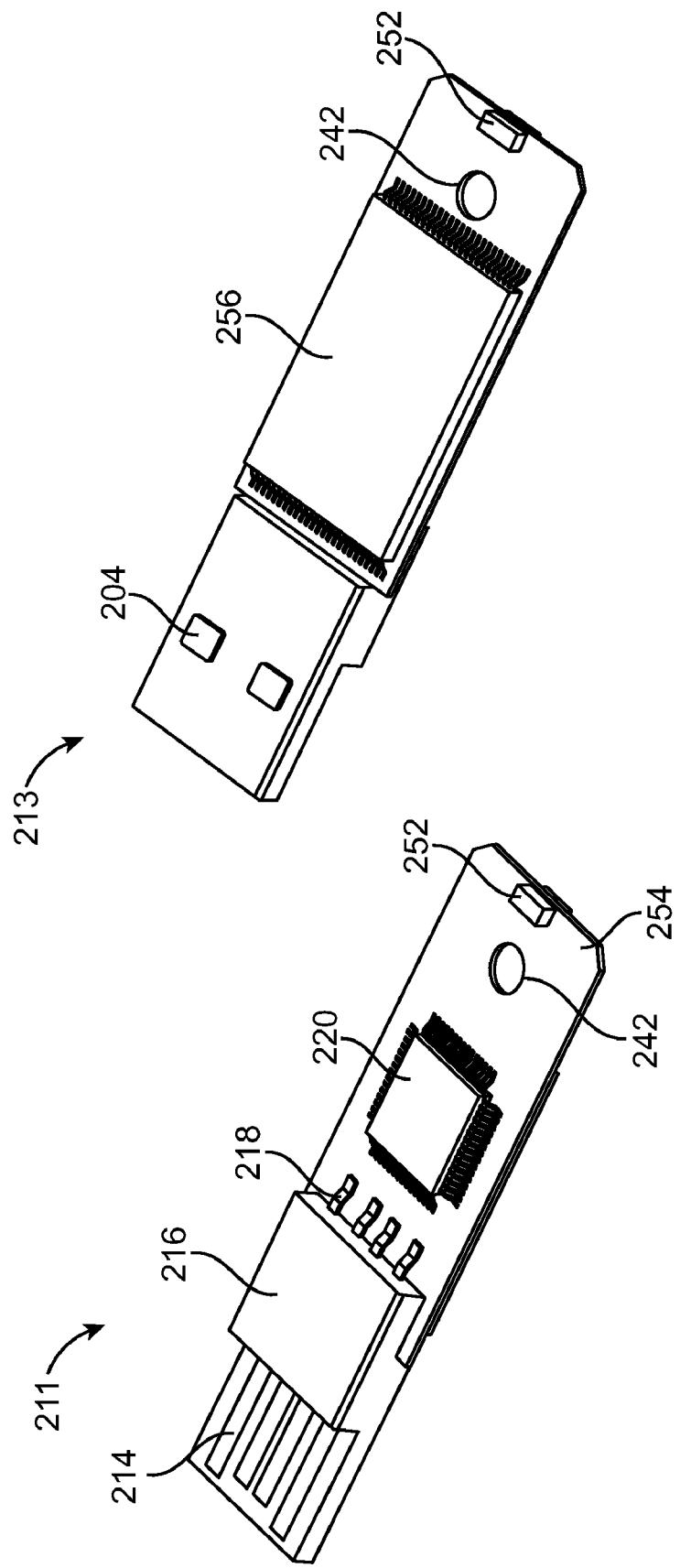

FIG. 19 shows a top side and a bottom side of the PCBA 210.

Figure 20:
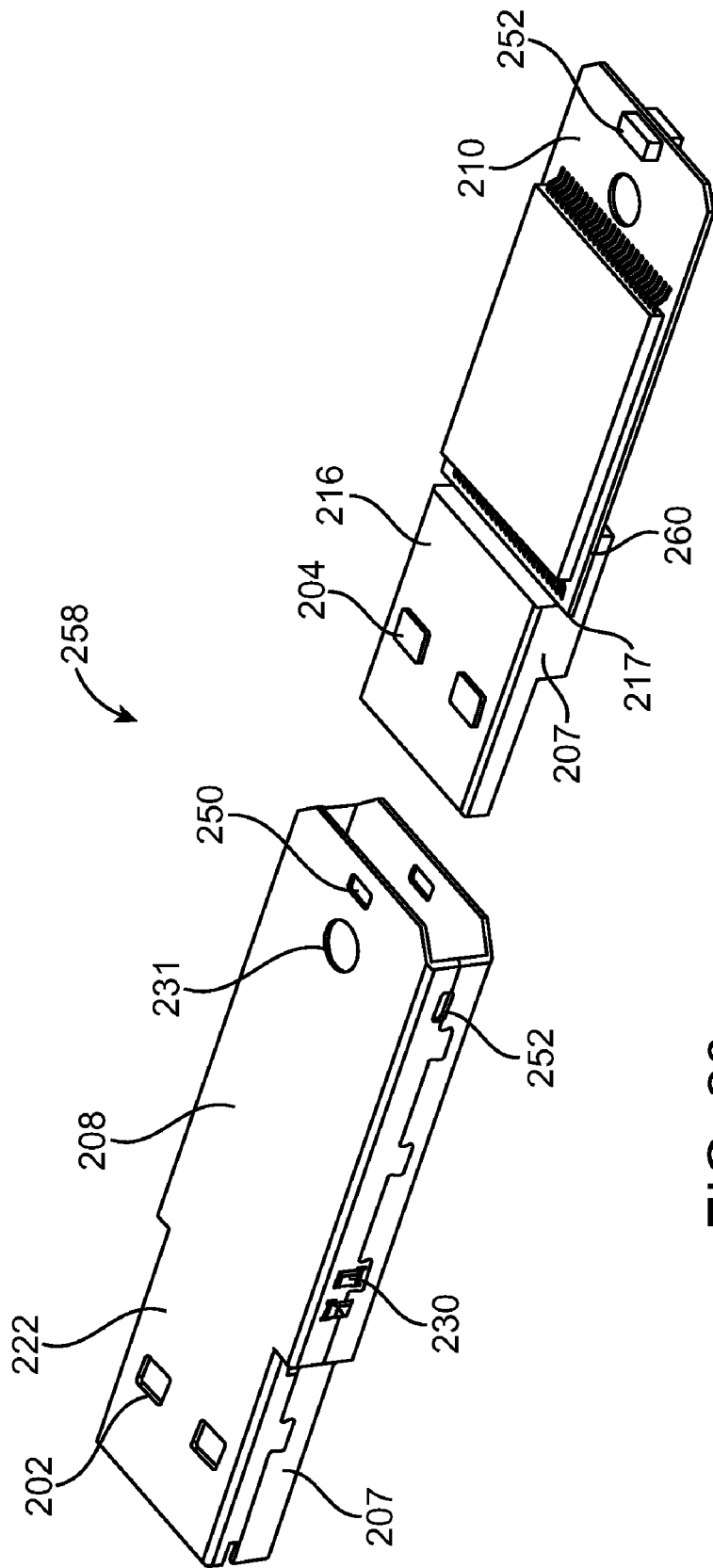

FIG. 20 shows the step 258 performed for inserting the PCBA 210 into the metal case 208.

Figure 21:
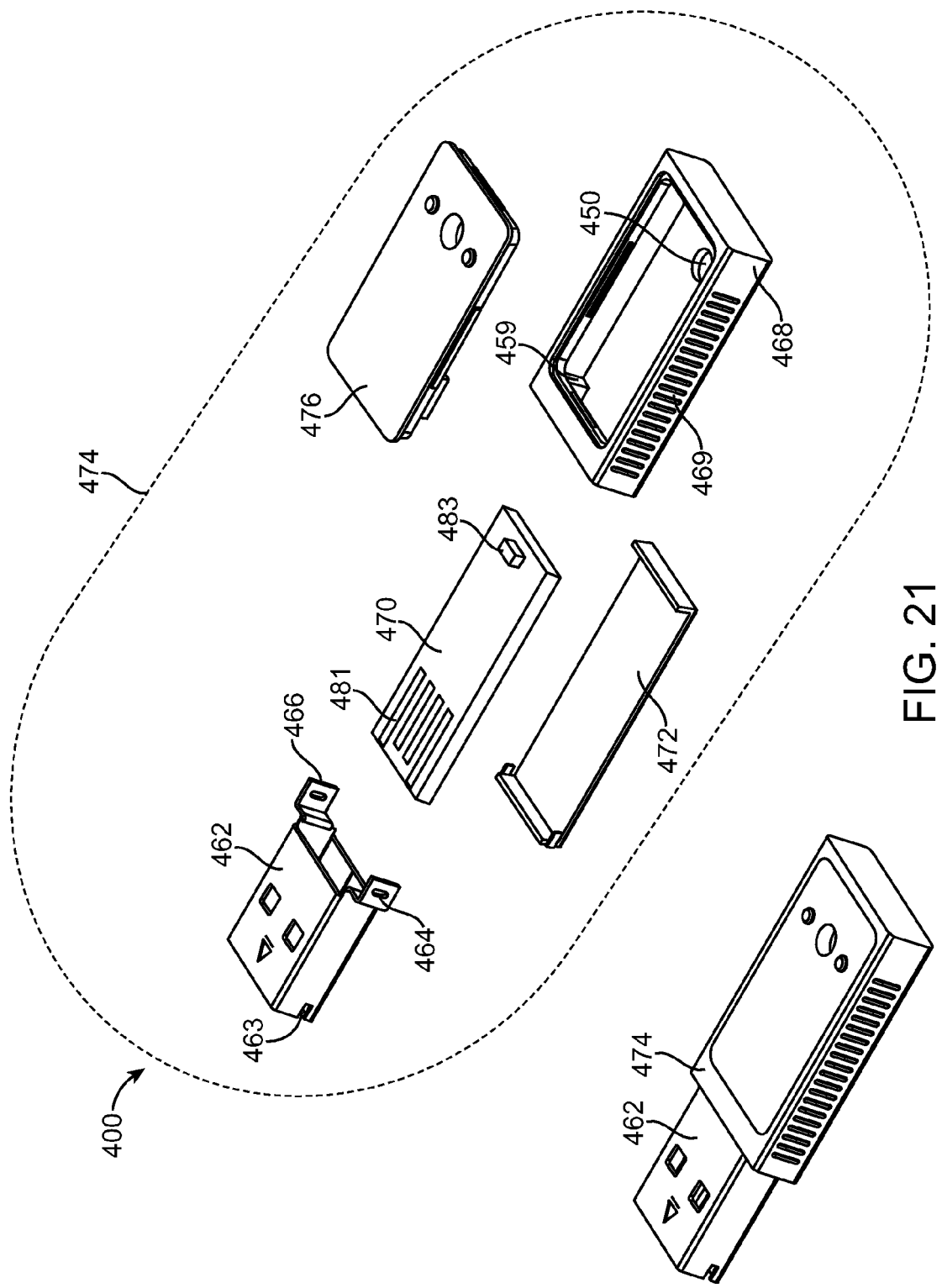

FIG. 21 shows parts of a USB flash drive 400, in accordance with yet another embodiment of the present invention.

Figure 22:
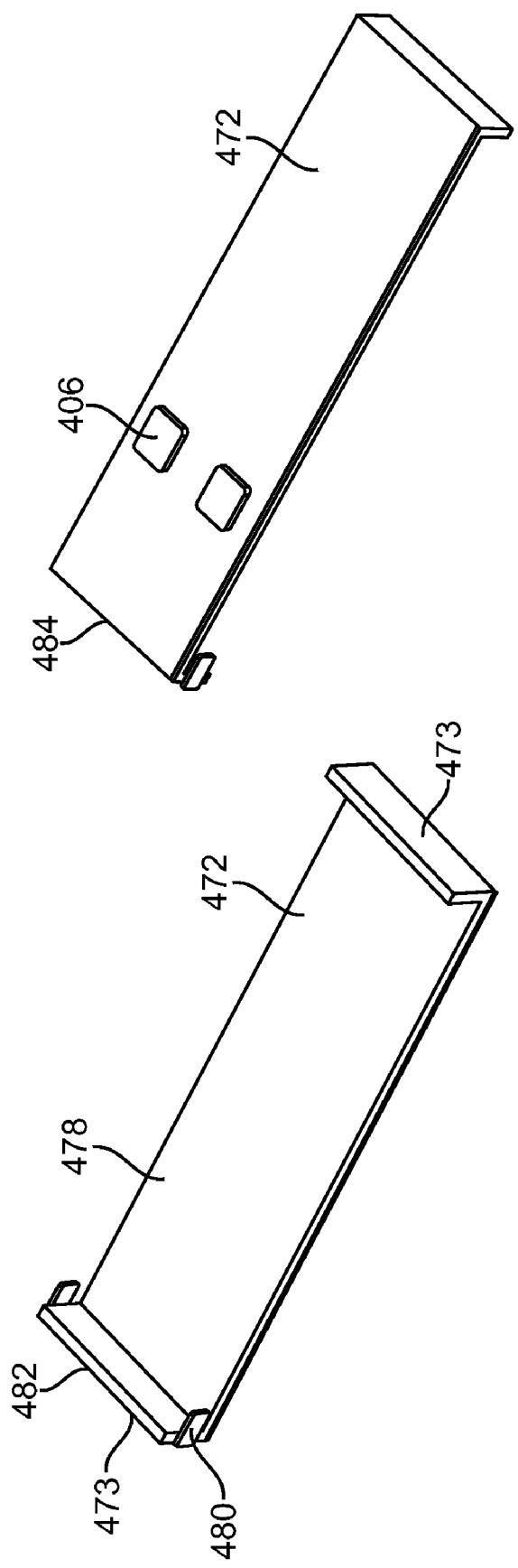

FIG. 22 shows a COB top side 482 and a COB bottom side 484, in accordance with an embodiment of the present invention.

FIG. 23(a) shows an angular perspective of the plastic housing 468 showing a side thereof that is opposite to that of the plastic housing's hollow or uncovered side and the fins 469.

FIG. 23(b) shows an opposite side of the sheet metal USB head 462 to that which was shown in FIG. 21.

FIG. 23(c) shows an un-covered slim USB device 494 including a housing molding structure 496 comprised of the plastic housing 468 and the sheet metal USB head 462 when the two are molded together.

FIG. 24 shows a top and a bottom side of the cover 476, in accordance with an embodiment of the present invention.

Figure 25:
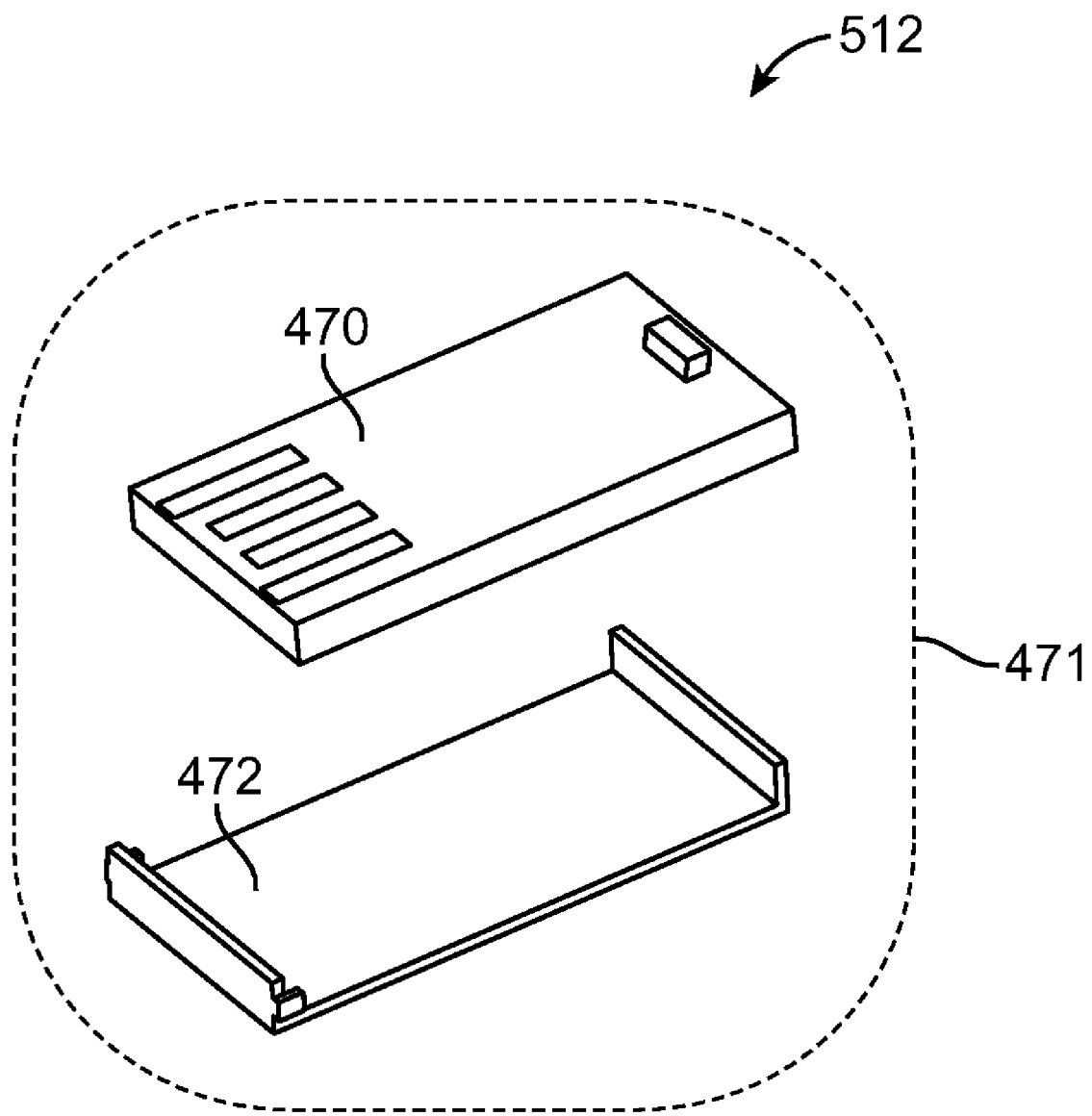
Figure 26:
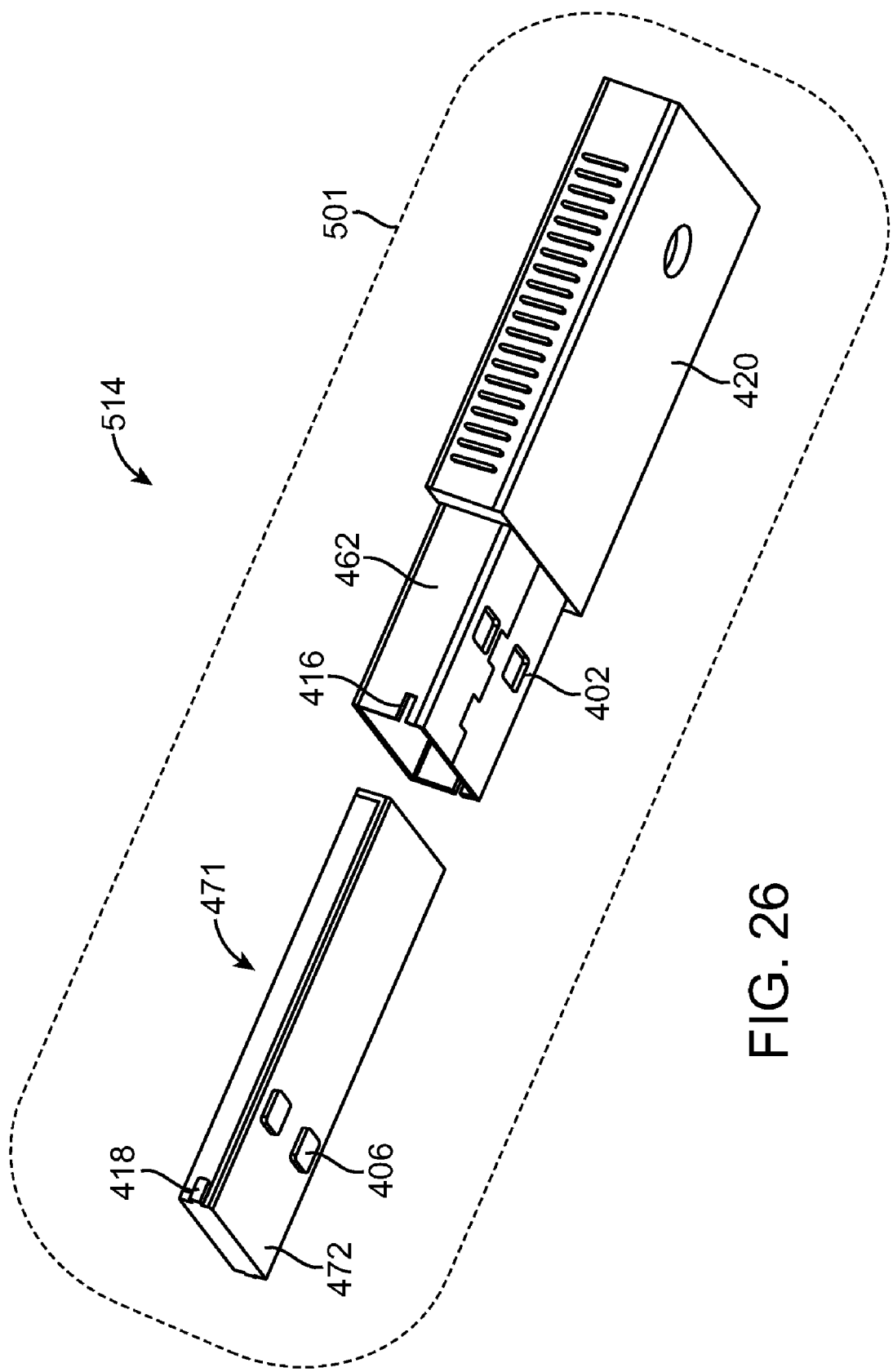
Figure 27:
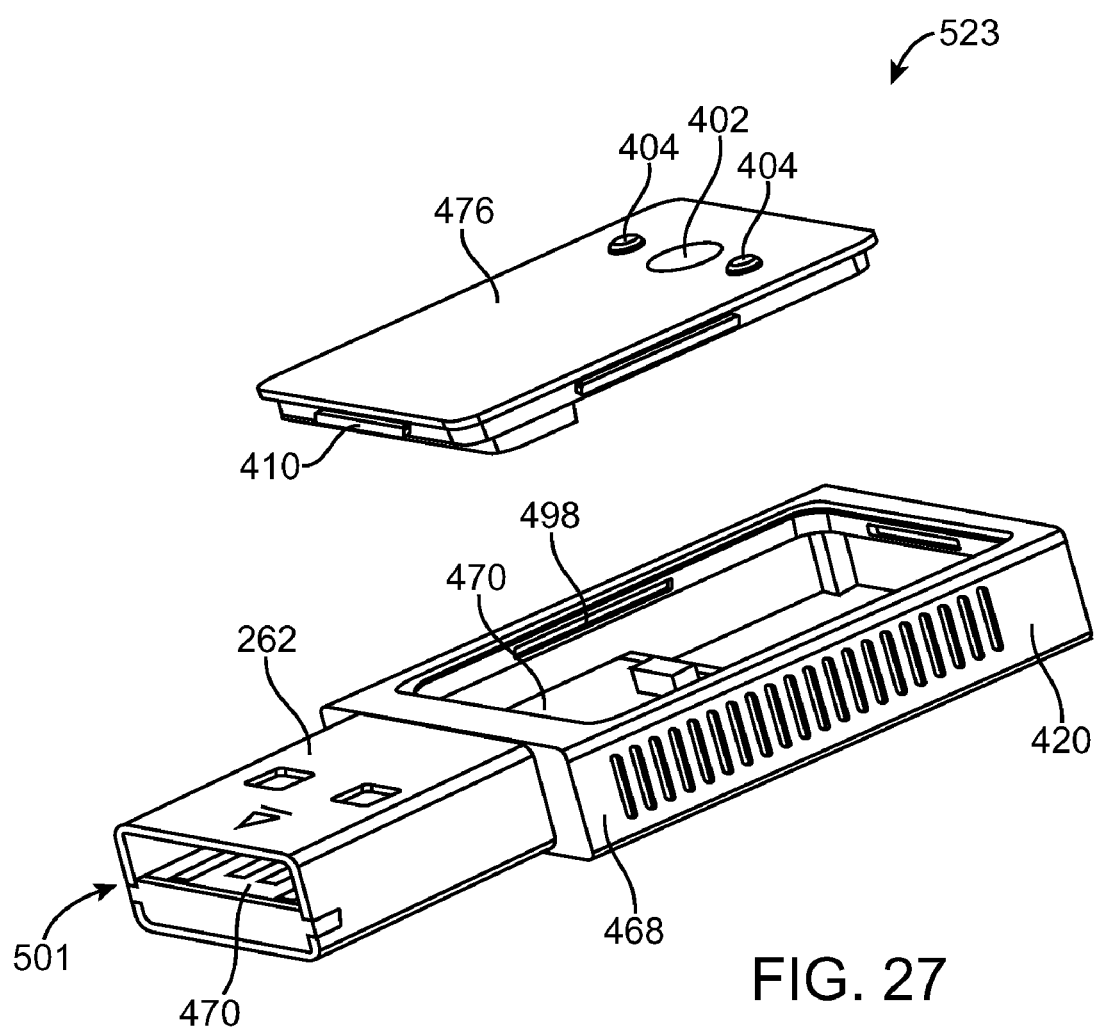

FIGS. 25-27 show some of the steps performed in manufacturing the slim USB device 474, in accordance with methods of the present invention.

FIG. 28(a) shows top and side angular view of a slim USB device 674 in accordance with another embodiment of the present invention.

FIG. 28(b) shows further details of the slim USB device 674 to include a COB support 672, a COB 670, which optionally includes an LED 652, a metal case 608 and an end cap 612 onto a top surface of which is disposed a USB device rivet throughhole 614.

Figure 29:
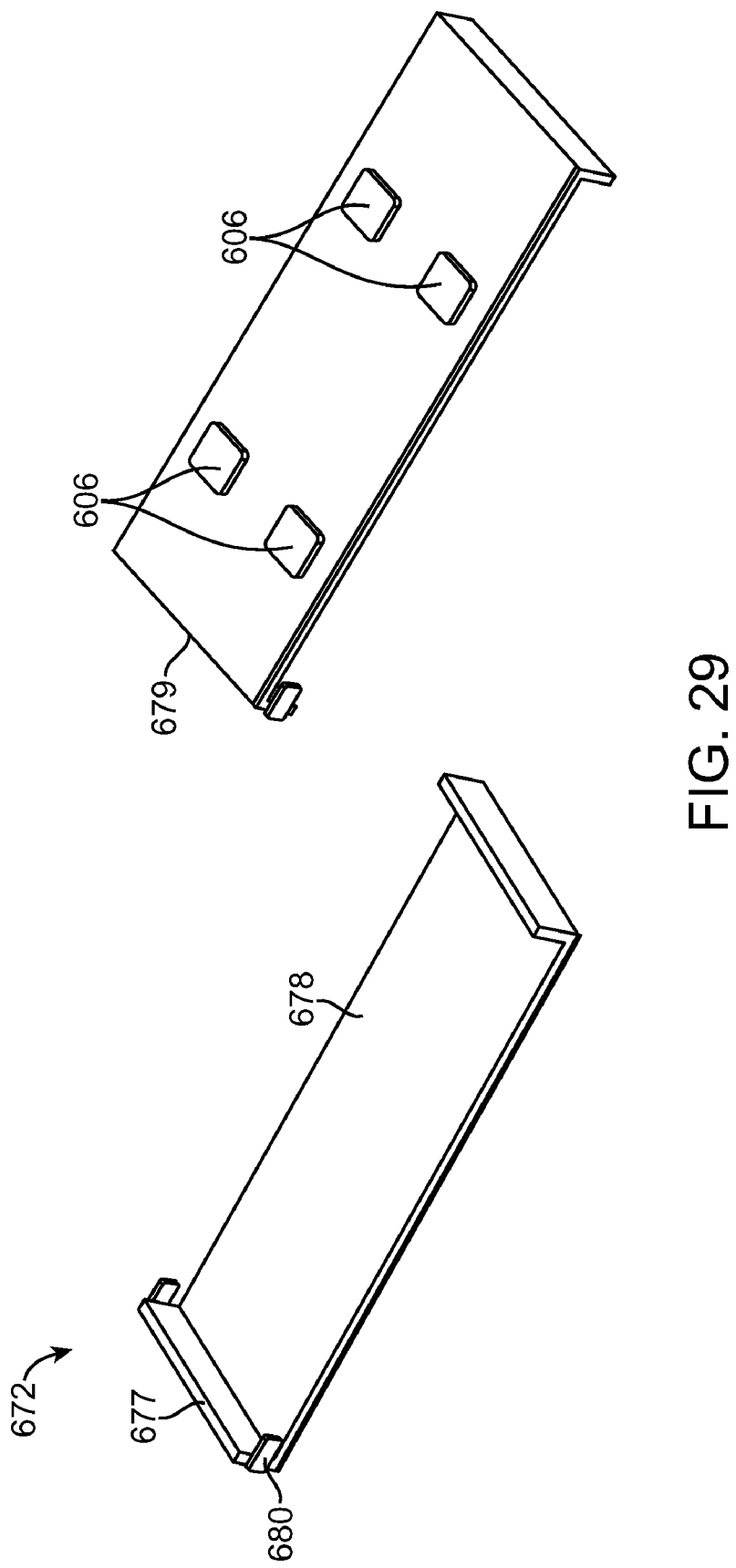

FIG. 29 shows further details of a top and a bottom side of the COB support 672, in accordance with an embodiment of the present invention.

Figure 30:
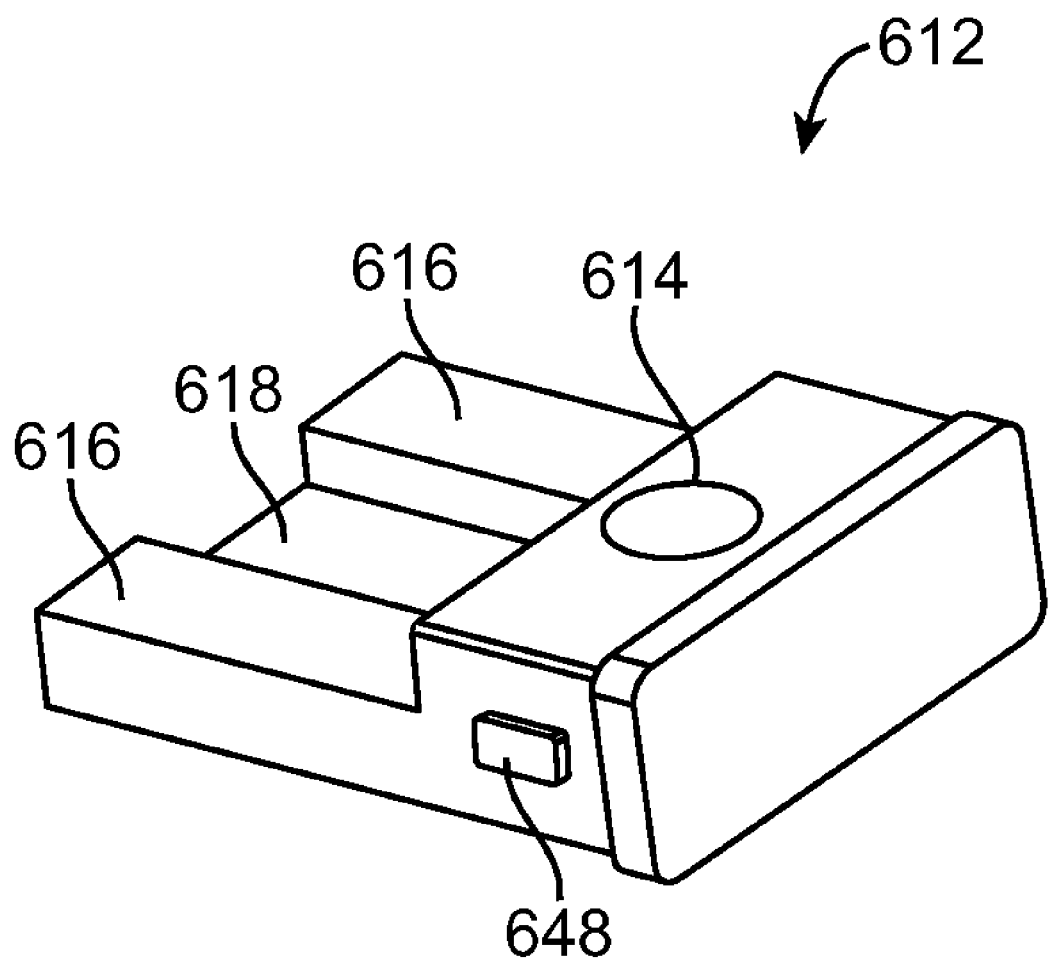

FIG. 30 shows further details of the end cap 612, in accordance with an embodiment of the present invention.

DETAILED DESCRIPTION OF THE PREFERRED EMBODIMENTS

Figure 1A:
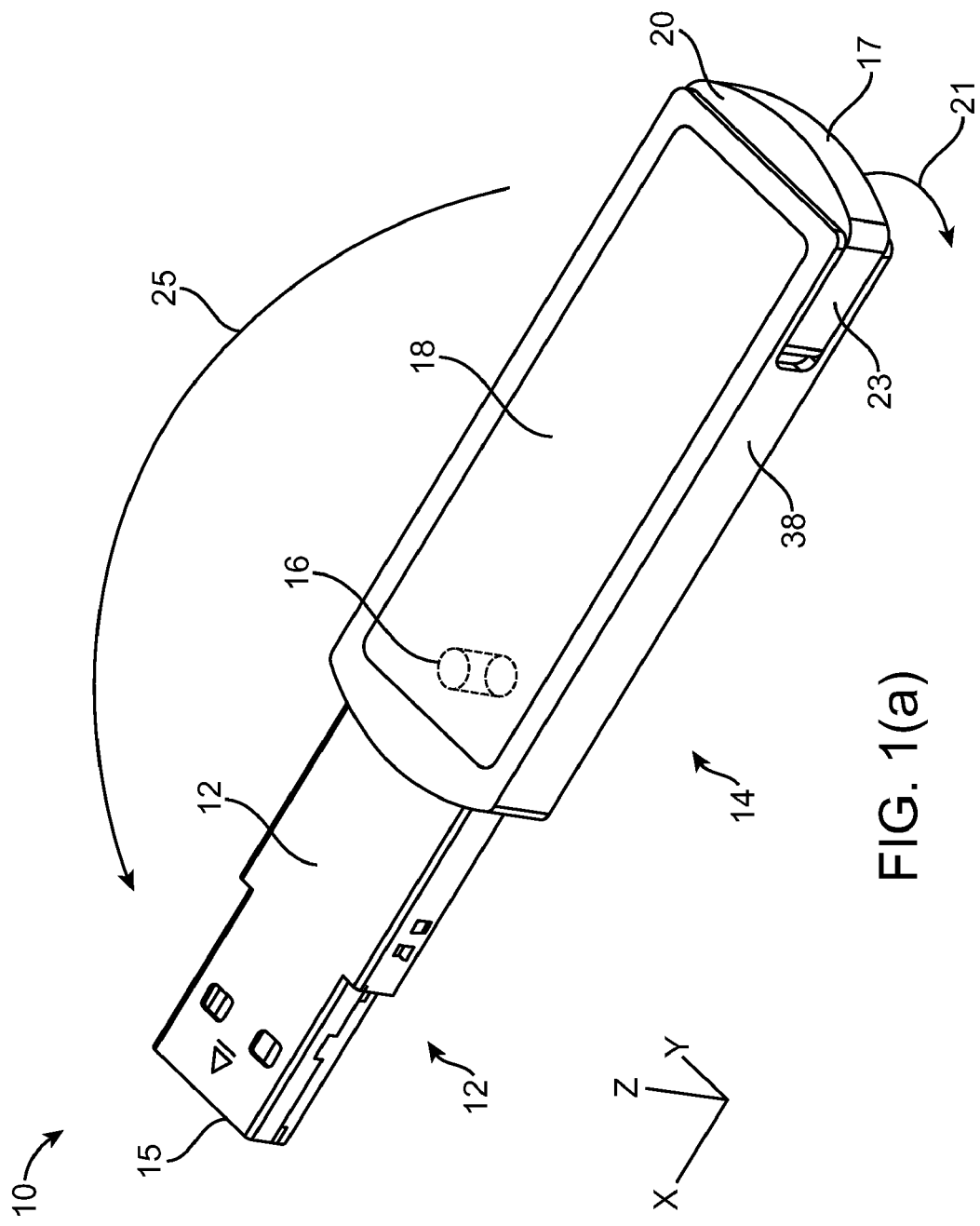
FIG. 1(e) shows a view of the disassembled parts 30 of the USB flash drive 10.

Referring now to FIG. 1(a), a universal serial bus (USB) flash drive 10 is shown to include a Slim USB device 12, a swivel rocker USB device opening 14, a USB device Rivet 16, a label 18 and a swivel rocker 20, in accordance with an embodiment of the present invention. FIG. 1(a) shows an angular perspective of the top side of the USB flash drive 10 shown at an angle so as to only show two of the four sides thereof. The swivel rocker USB device opening 14 is shown to be rectangular in shape as is the Slim USB device 12 although the latter is generally smaller in its length than the swivel rocker USB device opening 14.

The swivel rocker 20 and the Slim USB device 12 are a part of an assembly along with the swivel rocker USB device opening 14 generally comprising the USB flash drive 10. The Slim USB device 12 is shown connected to the swivel rocker USB device opening 14 by the rivet 16 and the swivel rocker 20 is similarly shown connected to the swivel rocker USB device opening 14 by protrusions not shown in FIG. 1(a). The label 18 covers the top of the swivel rocker USB device opening 14 thereby hiding or preventing the USB device Rivet 16 from being exposed. The label 18 may have a manufacturer's identification and/or information shown thereon. The USB device tip 15 of the Slim USB device 12, when extended outwardly as shown in FIG. 1(a), is generally used to connect the USB flash drive 10 to a host such as a Personal Computer (PC) or digital camera.

In one embodiment of the present invention, the USB device tip 15 establishes contact with a host in compliance with the Universal Serial Bus (USB) standard, known and adopted by the industry at large. In other embodiments of the present invention, the USB device tip 15 is a different type of connector.

The USB flash drive 10 typically includes memory, such as non-volatile or flash memory, in the form of EEPROM or EPROM, in one or more semiconductor, used to store information in files. Examples of such files include word processing documents or photographs.

In a closed or non-operational position, the Slim USB device 12 is substantially completely encapsulated within the cap swivel rocker USB device opening 14. In an open position, as shown in FIG. 1(a), the Slim USB device 12 is extended outwardly from the cap swivel rocker USB device opening 14 about the z-axis in a direction shown by the arrow 25. When opening the Slim USB device 12, the Slim USB device 12 is caused to pivot about the USB device Rivet 16 in a direction that is substantially about the z-axis. The swivel rocker 20 is shown to be generally encapsulated within the swivel rocker USB device opening 14 except at a swivel rocket end 17 shown protruding outwardly from the swivel rocker USB device opening 14. In the position shown in FIG. 1(a), the swivel rocker 20 will be referred to as being in the closed position. In the opened position, the swivel rocker 20 extends along the direction of the arrow 21 about the z-axis partially angularly out of the swivel rocker USB device opening 14. The swivel rocker 20 serves to allow the Slim USB device 12 to slightly extend out of the swivel rocker USB device opening 14 to allow the Slim USB device 12 to be then fully pulled out and moved in a direction consistent with the arrow 25 and positioned as shown in FIG. 1(a) for connection to a host. When the swivel rocker 20 is extended angularly out of the swivel rocker USB device opening 14 in a direction consistent with the arrow 21, a side 23 of the swivel rocker 20 moves inwardly to the inside of the swivel rocker USB device opening 14, as will be shown relative to subsequent figures.

The rivet 16 is generally made of a sturdy material. In an exemplary embodiment of the present invention, the rivet 16 is made of stainless steel, which helps to maintain the USB device 12 in place while rotating into and out of the cap 38.

The USB flash drive 10 advantageously secures the swivel rocker 20 and the Slim USB device 12 and further avoids loss of either, as both remain connected within the USB flash drive 10 unless intentionally removed for reasons other than use. In this manner, the USB flash drive 10 is a self-contained USB memory device. The LED light emits light through the end cap 40 and the swivel cap 38 at an area made out of transparent plastic to allow light to shine therethrough.

As will be further discussed and in accordance with the foregoing embodiment, the slim USB device 12 is locked into two locking positions, a first locking position that is when the slim USB device is in an open or 180 degree position and a second locking position with the slim USB device being in a closed or zero degree position.

Figure 1B:
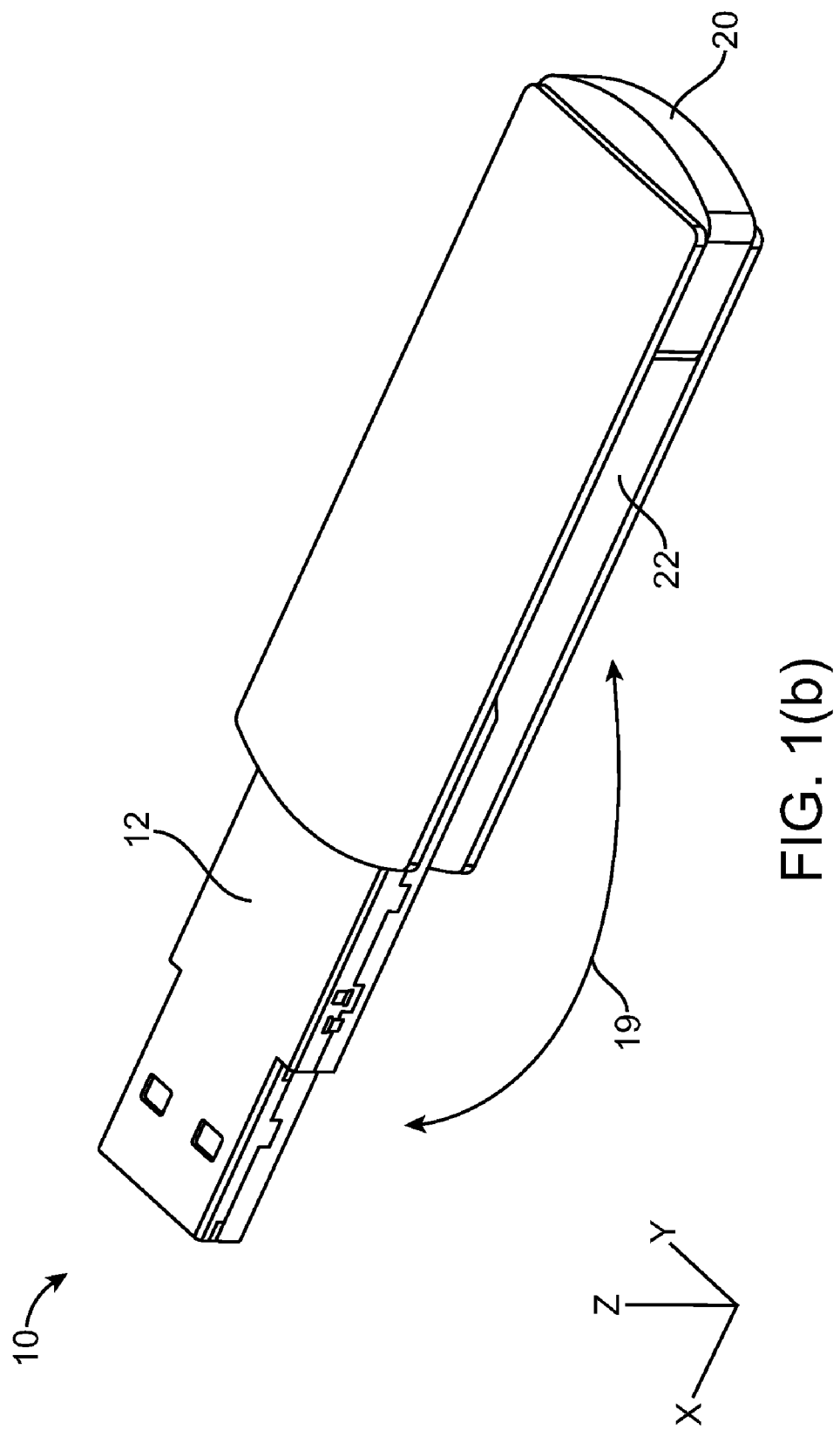

FIG. 1(b) shows an angular perspective of the bottom side of the USB flash drive 10 more specifically showing the swivel cap side slit 22 into which the Slim USB device 12 moves when being closed is shown. When moved along the z-axis or in a direction shown with respect to the arrow 19, in FIG. 1(b), the Slim USB device 12 is extended outwardly from the swivel rocker USB device opening 14 to open it for connection to a host or extended inwardly to be enclosed in the swivel rocker USB device opening 14 when the USB flash drive 10 is not in use. The swivel rocker USB device opening 14 thus protects the Slim USB device 12 from damage and secures Slim USB device 12.

Figure 1C:
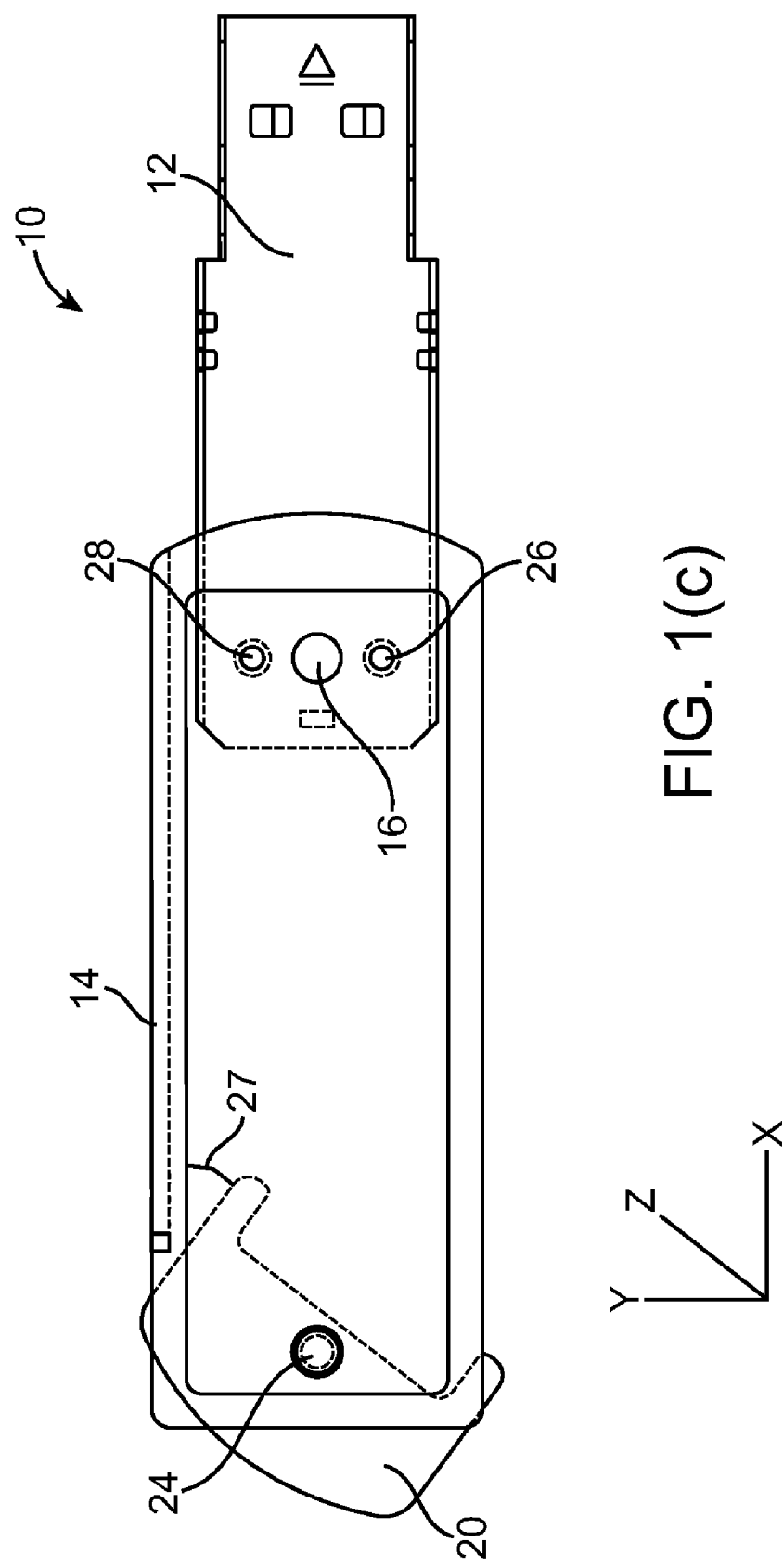

FIG. 1(c) shows a top view of the USB flash drive 10 with the swivel rocker 20 and the Slim USB device 12 extended outwardly or in an open position. The swivel rocker 20 is shown to pivot about the swivel rocket rivet 24 at an angle 27 from the x-axis initiating movement of the Slim USB device 12 from a closed position to an open position, the latter ultimately being moved approximately 180 degrees about the x-axis to being fully extended in the position (open) shown in FIG. 1(c). On one side of the USB device swivel cap 38 where the USB flash drive 10 is pivotally opened and close, a swivel rocker USB device opening 14 is shown therethrough the USB flash drive 10 slides to open or close. The swivel rocker USB device opening 14 forms only a part of the foregoing side, with the remainder thereof being covered. The swivel rocket rivet 24 is a part of the swivel rocker USB device opening 14 and is assembled from parts shown relative to subsequent figures.

The slim USB device 12 pivots about the USB device Rivet 16 and is locked into the position shown in FIG. 1(c) using the USB device pin 26 and USB device pin 28, which cause the Slim USB device 12 to be locked or snapped in substantially a 180 degree position relative to its closed position.

Figure 1D:
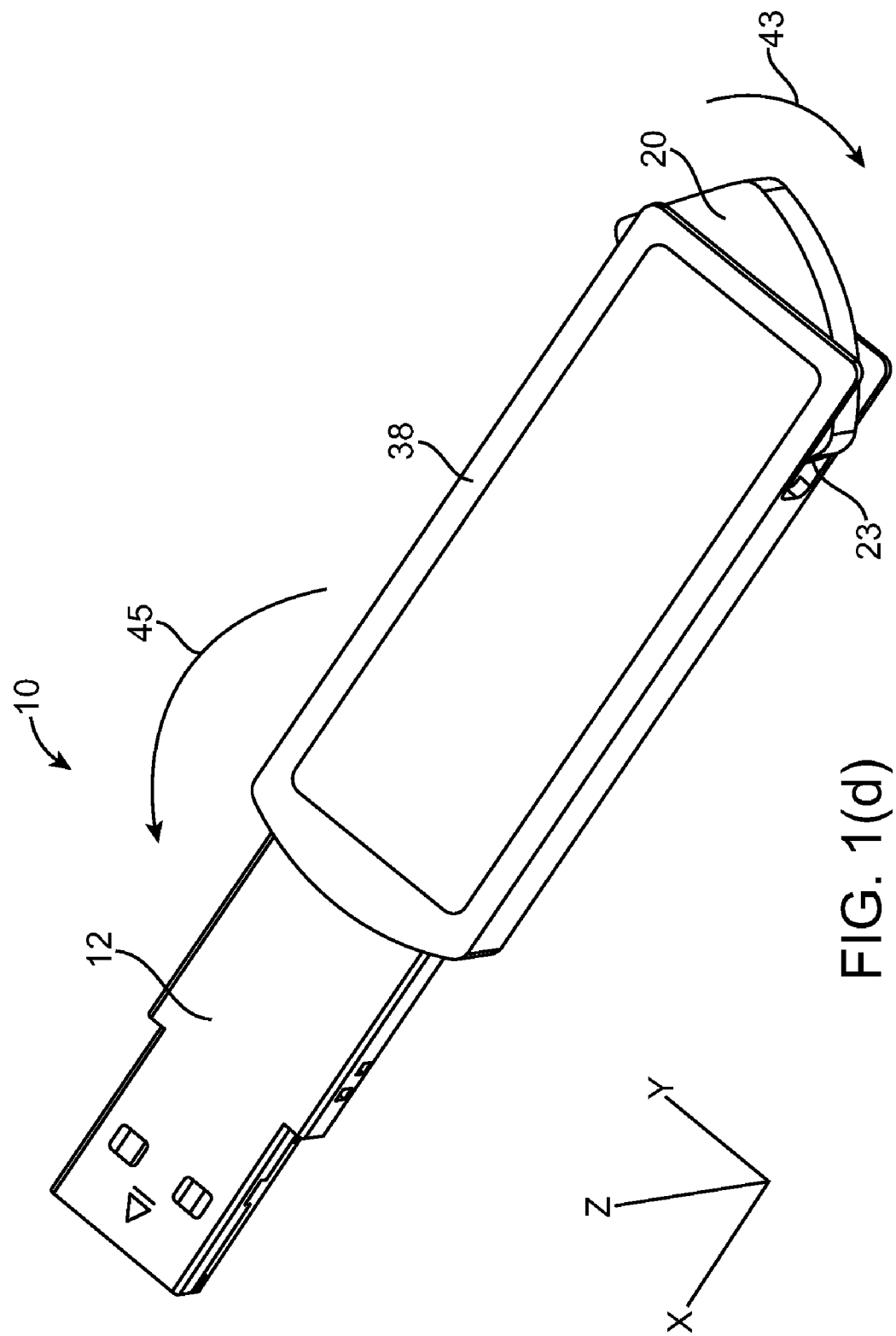

FIG. 1(d) shows an angular perspective of the top side of the USB flash drive 10 with the swivel rocker 20 and the Slim USB device 12 shown in open position. The swivel rocker 20 pivots about the z-axis in a direction along the arrow 43 to cause the Slim USB device 12 to be slightly pushed out of the swivel rocker USB device opening 14 in a direction along the arrow 45. Once slightly pushed out, the Slim USB device 12 may be further extended manually to move into the position shown in FIG. 1(d) or spring into the latter position using a spring or similar mechanism. The side 23 of swivel rocker 20 is shown inside the swivel rocker USB device opening 14 because of the position of the swivel rocker 20.

The swivel rocker 20 is advantageously attached to the swivel rocker USB device opening 14 to prevent loss thereof. In this manner, the swivel rocker 20 is further conveniently dislodged to open the Slim USB device 12 when desired, otherwise, the need not be cared for otherwise.

Figure 1E:
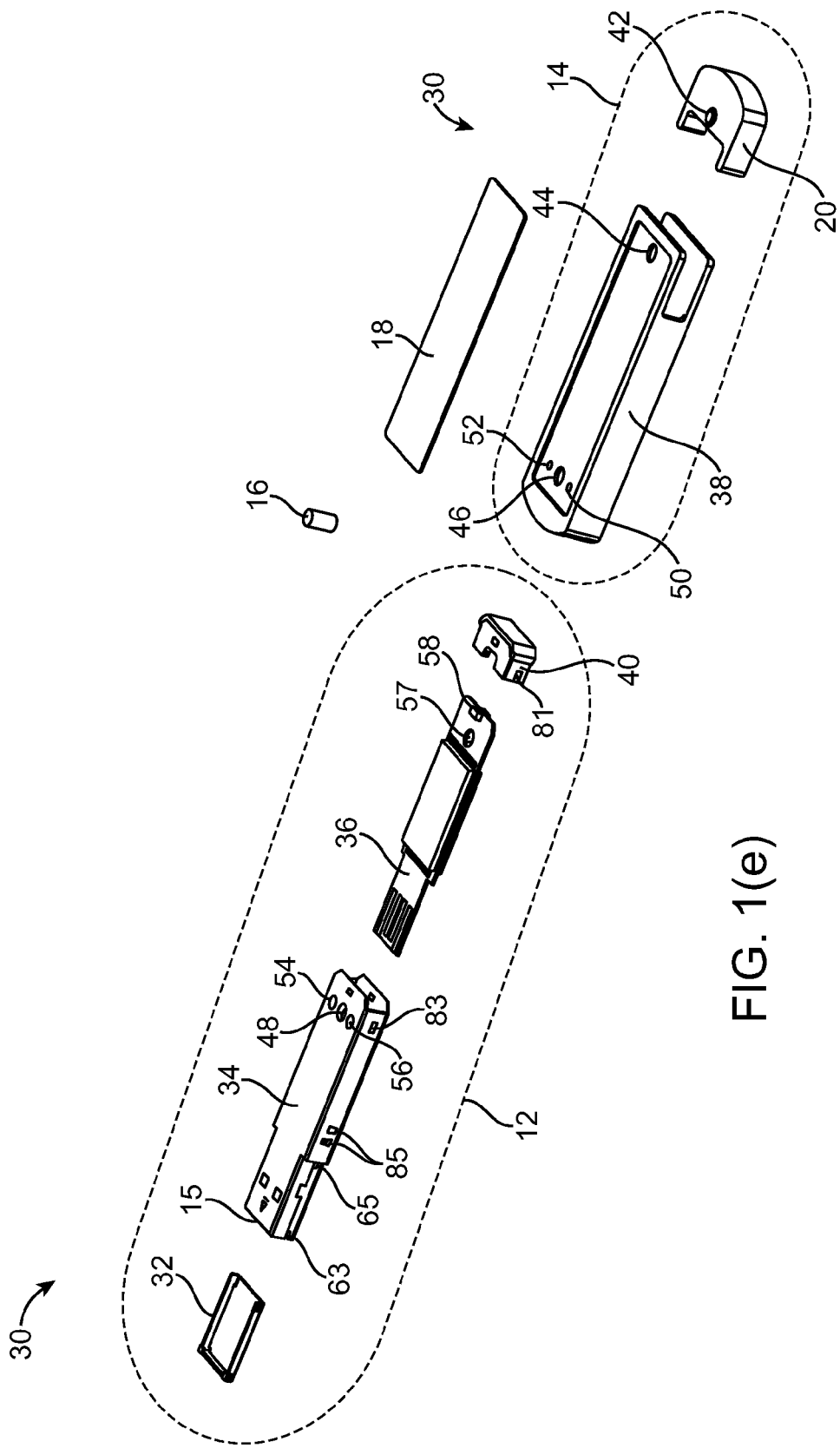

FIG. 1(e) shows a view of the disassembled parts 30 of the USB flash drive 10. The Slim USB device 12 of the USB flash drive 10 is shown to include a printed circuit board (PCB) support 32, a metal case 34, a printed circuit board assembly (PCBA) 36 and an end cap 40, in accordance with an embodiment of the present invention. The cap swivel rocker USB device opening 14 is shown to include a swivel cap 38, the label 18, the rivet 16 and the swivel rocker 20, in accordance with an embodiment of the present invention.

The PCB support 32 fits inside the metal case 34 to hold the PCBA 36 in place. The USB device tabs 85 are disposed on either side of the metal case 34 closer to the USB device tip 15 side thereof. The metal case 34 is shown to have disposed thereon on a top and a bottom side thereof and closer to the side in opposite to the USB device tip 15, a USB device throughhole 48 and on either side thereof on the top side of the metal case 34, USB device protrusion 54 and USB device protrusion 56. On either side of the metal case 34 closer to the end of the metal case 34 which is farthest away from USB device tip 15, is shown disposed end slot 83 for snapping the metal case 34 into place. The PCBA 36 is shown to include a PCBA rivet throughhole 57 and the LED 58 at an end farthest from the end placed into USB device tip 15. The end cap 40 is shown to have disposed on either side thereof end cap tabs 81.

The USB device swivel cap 38 is shown to have disposed on top and bottom surface thereof, a cap rivet hole 46 and cap hole 50 and cap hole 52 disposed on either side of the cap rivet hole 46 that is disposed on the top surface of the USB device swivel cap 38. The cap rivet hole 46, cap hole 50 and cap hole 52 are disposed on one end of the USB device swivel cap 38 and on an opposite end thereof, a hole 44 is disposed substantially in the middle of the width of the rectangularly-shaped USB device swivel cap 38. The swivel rocker 20 is shown disposed on the top surface thereof, a swivel rocker protrusion 42, which is used to snap the swivel rocker 20 into the USB device swivel cap 38 with the swivel rocker protrusion 42 snapping into hole 44.

In accordance with the foregoing embodiment, when the swivel rocker 20 is caused to extend outwardly in an open position about the z-axis and in parallel with the x-axis, the slim USB device 12 extends outwardly in an open position about the z-axis and in parallel with the x-axis. The slim USB device 12 travels through the slit 22 to open and close.

In summary, USB flash drive 10 includes the slim USB device 12, which has an end for coupling the USB flash drive 10 to a host and an opposite end. The USB flash drives 10 includes the swivel cap 38 having a side slit 22 that serves as an opening into which the slim USB device travels, the side slit 22 being disposed along a lateral side of the swivel cap 38. The USB device rivet 16 is placed into the slim USB device 12 and the swivel cap 38 to pivotally connect the swivel cap 38 to the slim USB device 12 at the opposite end of the slim USB device so that when the slim USB device is pivotally extendable outwardly from the side slit 22 in a first direction parallel to the x-axis. The swivel rocker 20 is disposed at the opposite end of the slim USB device 12 that is pivotally extendable outwardly from the opposite end of the slim USB device, in a second direction parallel to the x-axis, so that when the swivel rocker is caused to extend outwardly in the second direction, the slim USB device extends outwardly in the first direction.

Figure 2:
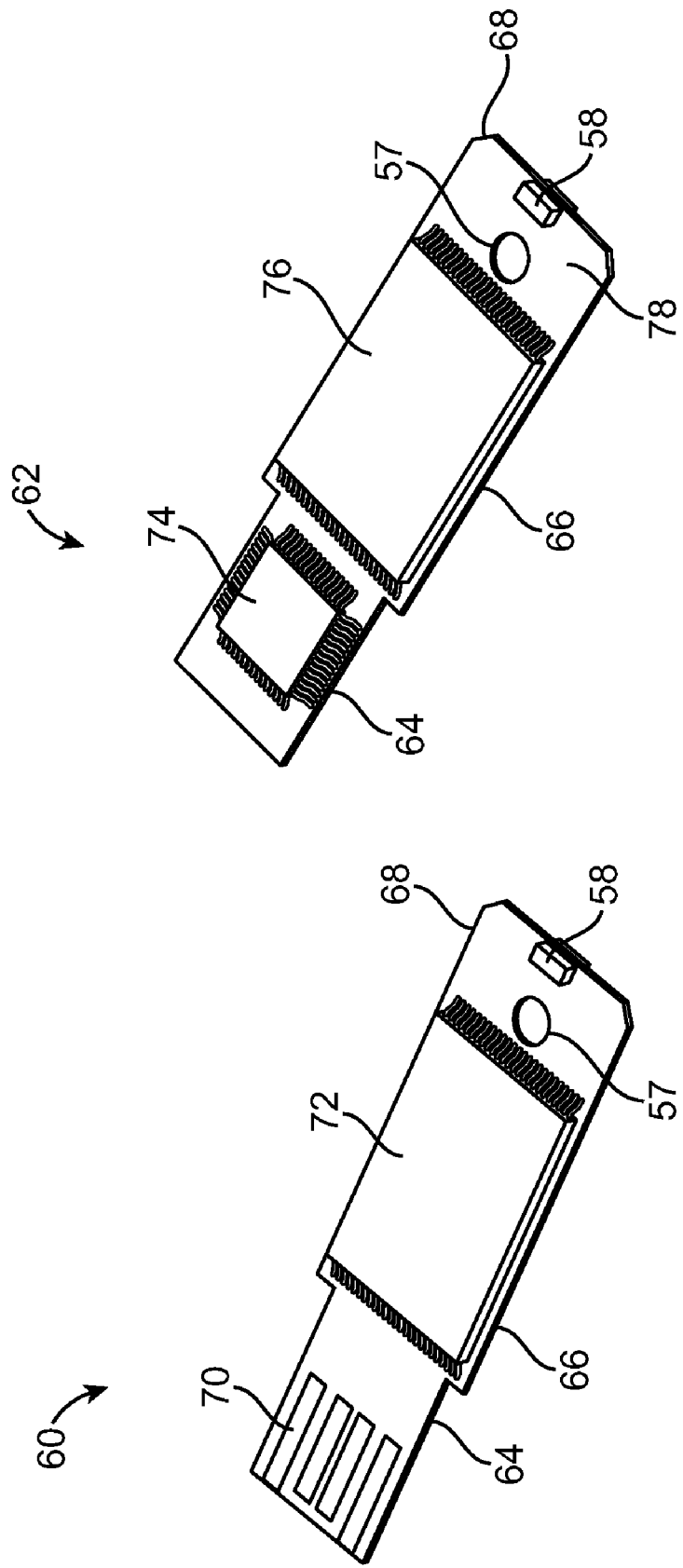
FIG. 2 shows the top and bottom sides of the PCBA 36, the PCBA top side 60 and the PCBA bottom side 62 of the PCBA 36 are shown to include various components, in accordance with various embodiments of the present invention.

FIG. 2 shows the top and bottom sides of the PCBA 36, the PCBA top side 60 and the PCBA bottom side 62 of the PCBA 36 are shown to include various components, in accordance with various embodiments of the present invention. The PCBA top side 60 is shown to include a PCBA front portion 64, a PCBA middle portion 66 and a PCBA end portion 68, which are all shared with the PCBA bottom side 62. On the PCBA front portion 64, there is disposed contact fingers 70, which are made of a conductive material for transferring electrical signals from the USB flash drive 10 to a host, in compliance with the USB standard.

The PCBA middle portion 66 is shown to have positioned thereon a memory integrated circuit (IC) 72 for storing files or information in digital form and generally made of non-volatile or flash memory. The PCBA end portion 68 is shown to have disposed substantially in the middle thereof, a PCBA rivet throughhole 57, which is shared by the PCBA bottom side 62 and on an end farthest from the memory integrated circuit (IC) 72, the LED 58. It should be noted that the LED 58 is optional but when present and used, signifies whether or not the USB flash drive 10 is connected to a host or operational by being lit or not.

The PCBA bottom side 62 is shown to include a controller integrated circuit (IC) 74 disposed substantially at its front portion and a memory integrated circuit (IC) 76 disposed at its middle portion and PCBA rivet throughhole 57 disposed at its end portion. Optionally, the LED 58 is disposed at an end of the PCBA bottom side 62 that is farthest from the front portion thereof. The LED 58, memory IC 76 and controller IC 74 are connected to a 78 which forms the surface (or side) of the PCBA 36 onto which the LED 58, memory IC 76 and controller IC 74 are electrically connected. The PCBA 60 or 62 are essential to the USB flash drive 10 in that they store information that can be stored in or retrieved by a host.

The contact fingers 70 and the front portion 64 comprise at least a part of a USB standard connector.

In an embodiment of the present invention, the PCBA 36 is similar to that which is shown and discussed herein except that the PCBA front portion 64 is replaced by a connector substrate and a COB. The foregoing alternative embodiment will be further described in other embodiments of slim USB device 12. It is understood that the dimensions of the PCBA 36 depend on and vary relative to the dimensions of the PCBA support 32 and the metal case 34.

Figure 3:
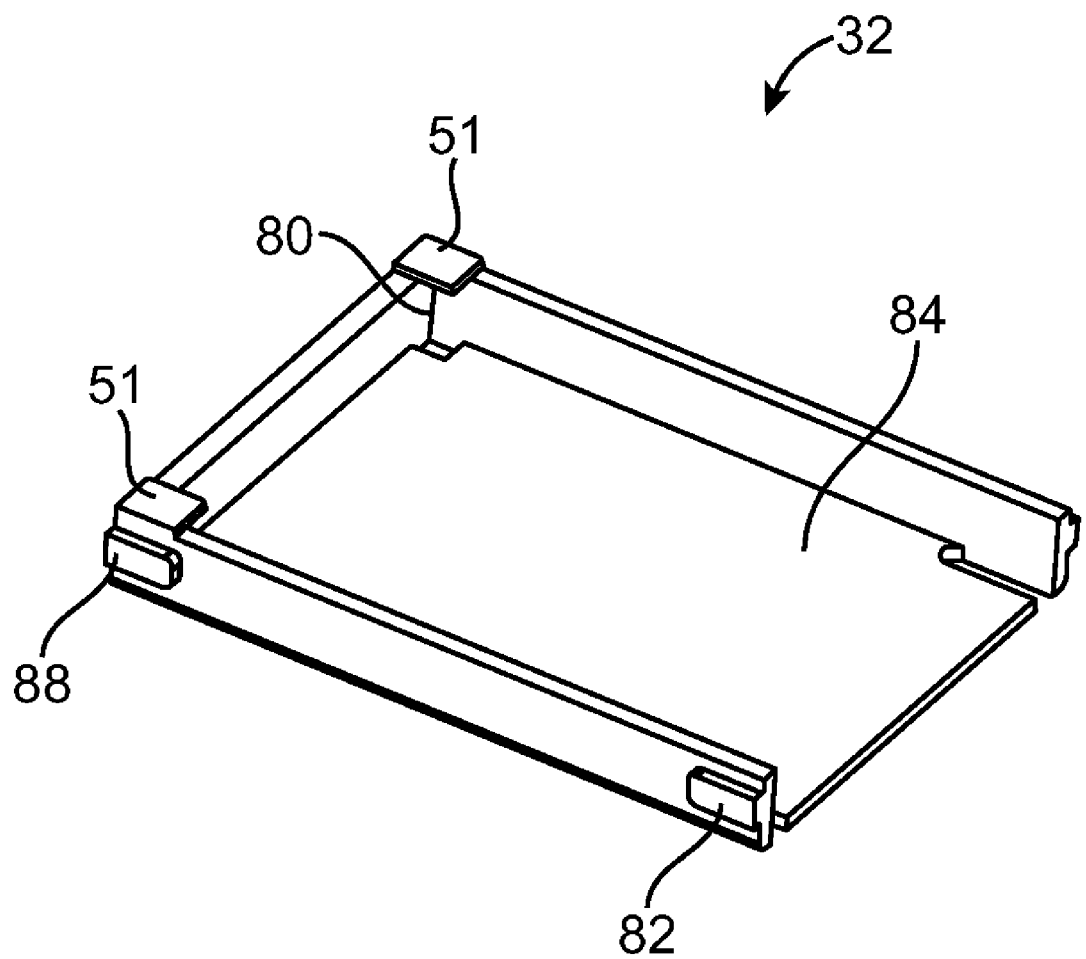
FIG. 3 shows a top angular perspective of the PCB support 32, in accordance with an embodiment of the present invention.

FIG. 3 shows a top angular perspective of the PCB support 32, in accordance with an embodiment of the present invention. The PCB support 32 is shown to include PCB support corners 80 disposed at one corner of each of the corners of the PCB support 32, a PCB tab 82 and a PCB tab 88 disposed on a lateral side of the PCB support 32 and a cut-out 84 shown forming the bottom of the PCB support 32 onto which the front portions of either of the PCBA 60 or 62 sits and fit into. The PCB tab 82 and PCB tab 88 snap into the metal case back slot 65 and metal case front slot 63 of the metal case 34, respectively, when the PCB support 32 is placed into the front portion of the metal case 34 thereby securing the PCB support 32 into the metal case 34.

The PCB support 32 is further shown to include two protrusion tabs 51, each disposed on top and parallel corners of the PCB support and specifically on top of the PCB support corners 80. Protrusion tabs 51 are to ensure that the front portion of PCBA 36 is secured in the proper location.

Figure 4:
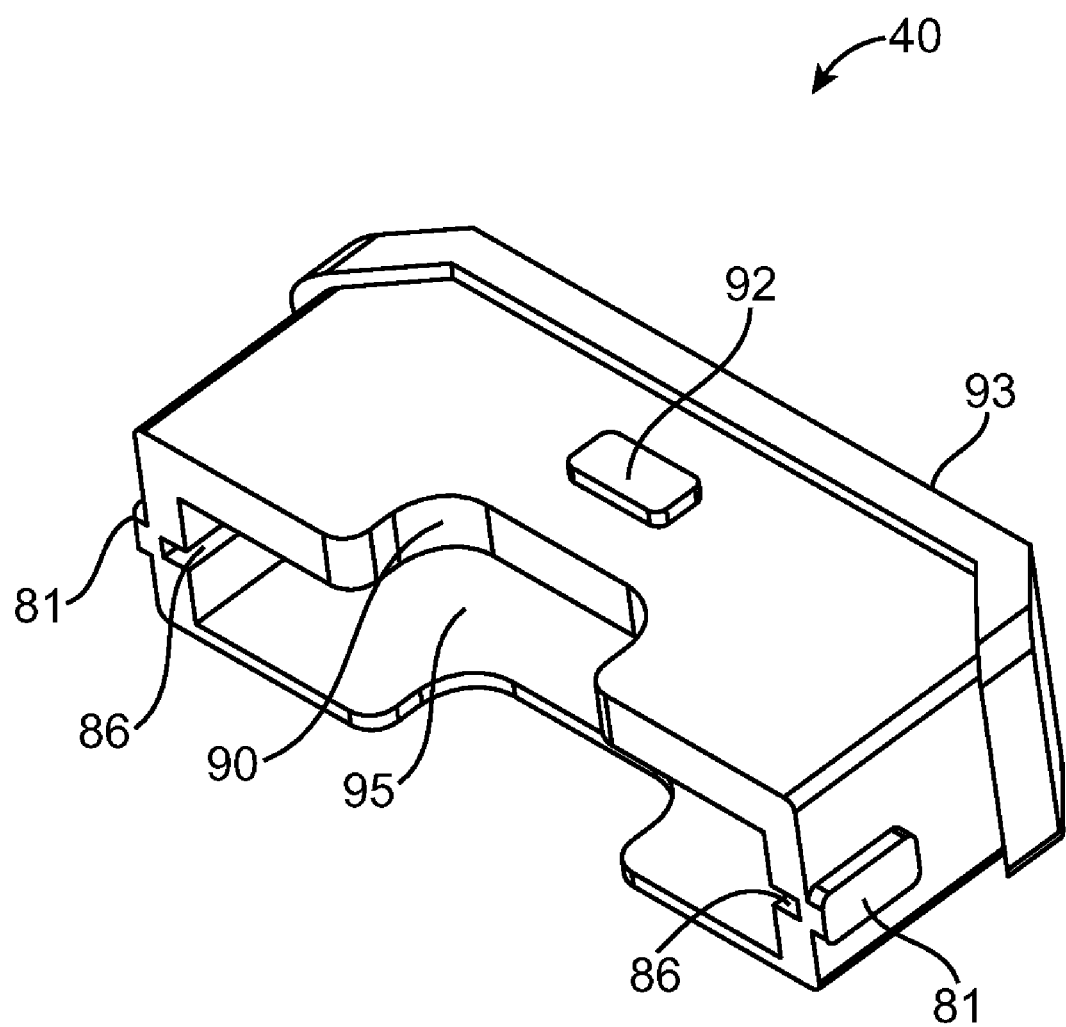
FIG. 4 shows a top angular perspective of the end cap 40, in accordance with an embodiment of the present invention.

FIG. 4 shows a top angular perspective of the end cap 40, in accordance with an embodiment of the present invention. The end cap 40 is shown to be generally shaped as a three-dimensional rectangular cube but with one closed end 93 and an open end 95 opposite to the closed end, a end cap protrusion 92 positioned generally in the middle of its top side and two side end cap grooves 86 disposed on either of its sides. The side end cap grooves 86 are used to slide the PCBA 36 into place in the end cap 40 and the end cap tabs 81 of the end cap 40 are used to secure the end cap 40 into the metal case 34 by snapping the end cap tabs 81 into the end slots 83. Similarly, a metal case slot 94 of the metal case 34 snaps into the end cap protrusion 92 of end cap 40 to further secure the metal case 34 into the end cap 40. The top end cap groove 90 of the end cap 40 is shown to be generally c-shaped so that the rivet 16 is allowed to fall through the metal case 34

FIG. 5 shows a top and side angular view of the metal case 34 to show its relevant components in greater detail. In FIG. 5, a metal case slot 94 shown disposed on the top side toward the end portion of the metal case 34 that his farthest away from the USB device tip 15, fits into the end cap protrusion 92 of the end cap 40 to secure the metal case 34 into the end cap 40 when the end cap 40 is slid into the metal case 34. Each of the metal case back slot 65 of metal case 34, located on either side of the USB device tip 15 of side of the metal case 34, house the PCB tab 82 of the PCB support 32 and the metal case front slot 63 of the metal case 34 house the PCB tab 88 of the PCB support 32 when the PCB support 32 is placed into the USB device tip 15 of metal case 34 thereby securing the PCB support 32 into the metal case 34. The USB device protrusion 54 of the metal case 34 fits into the cap hole 52 of the USB device swivel cap 38 and the USB device protrusion 56 of the metal case 34 fits into the cap hole 50 of the USB device swivel cap 38 thereby securing the metal case 34 into the USB device swivel cap 38. The USB device tabs 85 serves to align the PCBA 36 within the metal case 34 in a manner such that one of the USB device tabs 85 is flapped upwardly and the other is flapped downwardly to cause the alignment. It should be noted that a set of USB device tabs 85 is disposed on either side of the metal case 34, as will be shown in greater detail with respect to subsequent figures.

FIG. 5(a) shows the metal case 34 with a closer view of the USB device tabs 85, which is shown to include a metal case upper tab 131 and a metal case lower tab 133, in accordance with an embodiment of the present invention. As shown in FIG. 5(a), the USB device tabs 85 is zoomed in to show the metal case upper tab 131 flapped inside the metal case 34 but at the top of the USB device tabs 85 into which it is disposed whereas the metal case lower tab 133 is shown flapped inside the metal case 34 but at the bottom of the USB device tabs 85 into which it is disposed. Further views of the metal case upper tab 131 and metal case lower tab 133 are shown I FIGS. 5(b)-(e).

Namely, FIG. 5(b) shows a side view of the metal case upper tab 131 and metal case lower tab 133. FIG. 5(c) shows a closer side view of the metal case upper tab 131 and metal case lower tab 133. FIG. 5(d) shows the top side of the metal case 34, which includes the two sets of USB device tabs 85 with one set disposed on the left side of the metal case 34 being the metal case upper tab 131 and metal case lower tab 133 and another set, located in a like place along the side of the metal case 34 as that of the metal case upper tab 131 and metal case lower tab 133, as the metal case lower tab 135 and metal case upper tab 137.

FIG. 5(e) shows the inside of top and inside of the metal case 34 where the metal case upper tab 137, metal case lower tab 135, metal case upper tab 131 and metal case lower tab metal case lower tab 133 are located. As shown, the flaps of the latter each extend within the metal case 34.

FIG. 6 shows greater details of a top and side angular view of the USB device swivel cap 38, in accordance with an embodiment of the present invention. The top side of the USB device swivel cap 38 is shown to include a USB flash drive swivel cap recessed top side 104 on top which the label 18 is positioned. The USB flash drive swivel cap recessed top side 104 is recessed inwardly to allow the label 18 to be positioned on top of the USB device swivel cap 38 without protruding out or in a manner flat at the top side of the USB device swivel cap 38. In an alternative embodiment, the USB flash drive swivel cap recessed top side 104 is not recessed, yet, the label 18 is placed on top thereof in which case, the label 18 would not lay flat on top of the USB device swivel cap 38 so as to avoid protrusion, rather, it is slightly raised. Still alternatively, no label 18 is used in which case the USB flash drive swivel cap recessed top side 104 may be recessed or not.

A swivel cap throughhole 44 is shown to extend through the top and extend partially into the bottom side of the USB device swivel cap 38 but not breaking through. Cap hole 50 and 52 are shown to extend through the top side of the USB device swivel cap 38 only. Cap rivet hole 46 is shown to extend through the top and extend partial into the bottom side of the USB device swivel cap 38, but not breaking through. The USB device swivel cap 38 is shown to include USB flash drive swivel cap hollow end cap housing 100 positioned at an end of the USB device swivel cap 38 that is located under the 44 thereof, which is essentially a hollow area when the swivel rocker 20 is not connected and when the swivel rocker 20 is connected to the USB device swivel cap 38, it is used to house the swivel rocker protrusion 42.

FIG. 7 shows further details, at a top and side angular view, of the swivel rocker 20, in accordance with an embodiment of the present invention. The swivel rocker 20 is shown to have a swivel rocker push edge 110 located on either of its sides for use by a user of the USB flash drive 10 to push the swivel rocker 20 on one side when it is connected to the USB device swivel cap 38 to push out the Slim USB device 12 or to press the swivel rocker push edge 110 in to close the Slim USB device 12. The swivel rocker protrusion 42 of the swivel rocker 20, when slid into the USB device swivel cap 38, snaps into the 44 of the USB device swivel cap 38 to secure the swivel rocker 20 into the USB device swivel cap 38 from which point on, the swivel rocker 20 remains connected to the USB device swivel cap 38 until the swivel rocker protrusion 42 is pressed in to disengage from the 44 of the USB device swivel cap 38 to remove the swivel rocker 20 from the USB device swivel cap 38.

A swivel rocker cut-out clearance 112 forms the front side of the swivel rocker 20 and is located closer to the swivel rocker protrusion 42 than the back side of the swivel rocker 20, which is curved protruding outwardly from the USB device swivel cap 38 when the swivel rocker 20 is in a closed position. Each of the swivel rocker push edge 110 and the swivel rocker cut-out clearance 112 forms an entire side of the swivel rocker 20 in the manner shown in FIG. 7 or substantially being collectively u-shaped. The u-shape side of the swivel rocker 20 allows the swivel rocker push edge 110 thereof to fit into the swivel cap hollow end cap housing 100 of the USB device swivel cap 38 and to cause the swivel rocker 20 to pivot about the z-axis when the swivel rocker protrusion 42 of the swivel rocker 20 is snapped into the 44 of the USB device swivel cap 38 and the swivel rocker push edge 110 is either pushed into the USB device swivel cap 38 to open or close the swivel rocker 20.

FIGS. 8-14 show steps used to manufacture the USB flash drive 10, in accordance with a method of the present invention. In FIG. 8, at step 114, the PCB support 32 is positioned into the metal case 34 by pressing the PCB support 32 into the metal case 34 until the PCB tab 82 of the PCB support 32 snap into the metal case back slot 65 of the metal case 34 and the PCB tab 88 of the PCB support 32 snap into the metal case front slot 63 of the PCB support 32. It should be noted that two metal case back slots 65s are located on either side of the USB device tip 15 of the metal case 34 in the positions shown in FIG. 8 and two metal case front slots 63s are located on either side of the USB device tip 15 of the metal case 34 in the positions shown in FIG. 8. Similarly, two PCB tabs 82s are located on either side of the PCB support 32 in the positions shown in FIG. 8 and two PCB tabs 88s are located on either side of the PCB support 32 in the positions shown in FIG. 8. A metal case sub-assembly 124 is formed when the PCB support 32 is suitably in place inside of the metal case 34, made of the metal case 34 and the PCB support 32 located therein.

Next, at step 118 of FIG. 9, the PCBA 36 is placed into the metal case sub-assembly 124 formed in FIG. 8. More specifically, the PCBA 36 is slid into the metal case sub-assembly 124 at an end of the metal case sub-assembly 124 that is opposite to the end holding the PCB support 32 in place. The PCBA 36 is shown to have two PCB edges 120s at either of its sides before the PCBA front portion 64. The metal case sub-assembly 124 is shown to have a metal case sub-assembly front portion 122 disposed to encapsulate the PCB support 32. When the PCBA 36 is positioned in its entirety within the metal case sub-assembly 124, the PCBA front portion 64 of the PCBA 36 is located within the metal case sub-assembly front portion 122 of the metal case sub-assembly 124 and the remainder of the PCBA 36 is located in within the inside of the remainder of the metal case sub-assembly 124. When slid into the metal case sub-assembly 124, the PCB edges 120 of the PCBA 36 slide through the USB device tabs 85 into the PCB support 32 with the PCBA rivet throughhole 57 of PCBA 36 lining up with the USB device throughhole 48 of metal case 34 to allow for the USB device Rivet 16 to go therethrough. The USB device tabs 85 of the metal case sub-assembly 124 are used to guide the PCB edges 120 on either side of the metal case sub-assembly 124 so that each of the PCB edges 120 is aligned between two USB device tabs 85. Once the PCBA 36 is securely placed into the metal case sub-assembly 124, a PCBA sub-assembly 170 is formed.

In FIG. 10, at step 130, the end cap 40 is pressed into the metal case 34, which is a part of the PCBA sub-assembly 170. In doing so, the end cap tabs 81 of the end cap 40 is snapped into the 83 of the metal case 34 on each side of the end cap 40 and the metal case 34. Once the end cap 40 is in tact in the PCBA sub-assembly 170, a metal case and end cap sub-assembly 172 is formed. Furthermore, the PCBA 36 within the metal case 34 is completely secured inside of the metal case 34 with the PCBA front portion 64 being supported by the PCB support 32 and the PCBA middle portion 66 being supported by the USB device tabs 85 and the PCBA end portion 68 being supported by the end cap 40.

In FIG. 11, at step 132, the swivel rocker 20 is pressed into the USB device swivel cap 38. More specifically, the swivel rocker 20 is placed into the swivel cap hollow end cap housing 100 of the USB device swivel cap 38 and pressed therein until the swivel rocker protrusion 42 snaps into the 44 thereby connecting the swivel rocker swivel rocker 20 to the USB device swivel cap 38 and forming the swivel rocker rivet 24. Upon the swivel rocker 20 being securely pressed into the USB device swivel cap 38, a swivel cap sub-assembly 174 is formed.

In FIG. 12, at step 134, the metal case and end cap sub-assembly 172 is pressed into the swivel cap sub-assembly 174, at an end of the swivel cap sub-assembly 174 that is in opposite to the swivel rocker 20, until the USB device protrusion 54 and USB device protrusion 56 of the metal case 34 snap into the cap hole 52 and cap hole 50 of the USB device swivel cap 38, respectively, to form the 176. In FIG. 12, the metal case 34 is shown to include ridges 49, dispersed along a lateral side thereof. The ridges 49 are formed when a sheet of metal from which the metal case is made is cut to form the metal case. The ridges 49 serve to securely enclose the metal case when the sheet of metal is wrapped around to form a hollow rectangular shape and are positioned into indentations, located at like locations on an opposite side of the metal sheet, to form the metal case 34.

In FIG. 13, at step 136, the USB device Rivet 16 is pressed through the USB device rivet hole 16 of the USB device swivel cap 38 and there through to pivotally connect the metal case and end cap sub-assembly 172 to the swivel cap sub-assembly 174. The USB device Rivet 16 is pressed into the USB device rivet hole 16 at the top surface of the USB device swivel cap 38 all the way into the bottom surface of the USB device swivel cap 38. Once the USB device Rivet 16 is pressed into the USB device swivel cap 38, a 178 is formed.

In FIG. 14, at step 138, the label 18 is placed onto the swivel cap recessed top side 104 of the USB device swivel cap 38 to form the USB flash drive 10. It should be noted that the Slim USB device 12 is shown in an open position in FIG. 14 but when pivoted about the z-axis into the side slit 22, in a direction shown by the arrow 184, it is in a closed position when substantially within the USB device swivel cap 38. Similarly, the swivel rocker 20 is shown in a closed position in FIG. 14 but when pivoted outwardly about the z-axis, as shown by the arrow swivel rocker rivet 24, it is opened. While the Slim USB device 12 travels no more than 180 degrees about the z-axis when being opened or closed, the swivel rocker 20 travels at an angle less than 90 degrees or enough to kick the Slim USB device 12 out of its position. The manner in which the Slim USB device 12 is opened and closed will now be discussed relative to FIG. 15.

FIG. 15 shows the USB flash drive 10 with the Slim USB device 12 being opened and traveling in a direction shown by the arrow 190. In a closed position, the Slim USB device 12 is referred to as being at a zero (0) degree angle and at a fully extended or open position, the Slim USB device 12 is referred to as being at a 180 degree angle. The swivel rocker 20 is turned by a user of the USB flash drive 10 from a closed position to invoke movement of the Slim USB device 12. That is, the swivel rocker push edge 110 of the swivel rocker 20 that is located on a side thereof closest to the wall of the side slit 22 is turned in a clockwise position (along the direction of the arrow 192, which causes the USB device tip 15 of the slim USB device 12 to be pushed out of its closed position and at least a portion thereof extending outside of the USB device swivel cap 38. The movement of swivel rocker 20 need only be enough to extend the Slim USB device 12 out of the USB device swivel cap 38. The swivel rocker 20 travels an angle 27 from which point on, the user of the USB flash drive 10 can further extend the Slim USB device 12 to an open position, which is secured by the USB device protrusion 54 snapping into the cap hole 50 and the USB device protrusion 56 snapping into the cap hole 52 when the slim USB device 12 pivots at 145 substantially 180 degrees from its closed position. The snapping of the USB device protrusion 54 and the USB device protrusion 56 into their respective protrusions, the slim USB device 12 is prevented from moving further from its open or 180-degree position. The swivel rocker 20 pivots at 143.

FIG. 16 shows the USB flash drive 10 where the Slim USB device 12 and the swivel rocker 20 are at a closed position and completed inside of the USB flash drive 10. The USB device protrusion 54 snaps into the cap hole 52 and the USB device protrusion 56 snaps into the cap hole 50 when the Slim USB device 12 is closed so as to maintain a closed position and prevent the Slim USB device 12 from traveling while it is closed.

FIG. 16(a) shows exemplary dimensions of the USB flash drive 10. In an exemplary embodiment of the present invention, as shown in FIG. 16(a), the length of the slim USB device 12 from 145 to the end of USB device tip 15 is shown, at L1, to be 38.3 millimeters (mm). From 145 to through the slim USB device 12 but only to the swivel rocker push edge 110 of the swivel rocker 20 is shown by L2 to be 35.3 mm As seen in FIG. 16(a), the swivel rocker push edge 110 of the swivel rocker 20 slightly overlaps a portion of the USB device tip 15 of the Slim USB device 12 so that it may come in sufficient contact with the USB device tip 15 to initiate the Slim USB device 12 to travel to its open position.

FIG. 17 shows the USB flash drive 10 where the Slim USB device 12 in shown to be in an open position while the swivel rocker 20 is shown to be in a closed position. In the opened position, the USB device protrusion 56 of the Slim USB device 12 snaps into the cap protrusion 52 and the USB device protrusion 54 snaps into the cap protrusion 50 thereby preventing the Slim USB device 12 from moving. This advantageously keeps the Slim USB device 12 in the same position, which is particularly important when the USB flash drive 10 is removably connected to a host. It is undesirable for the Slim USB device 12 to move when electrical coupling is to be maintained. The Slim USB device 12 is moved in the closed position by the user of the USB flash drive 10 pushing the Slim USB device 12 toward the side of the USB device swivel cap 38. In an open position, the Slim USB device 12 is extended to 180 degrees.

FIG. 18 shows a top and side angular view of a USB flash drive 200 to include a slim USB device 274, which includes a swivel rocker USB device opening 14, in accordance with another embodiment of the present invention. The slim USB device 274 is shown to be similar to the slim USB device 12 but having a different internal structure.

FIG. 18(*a*) shows a view of the disassembled slim USB device 274. To this end, FIG. 18(*a*) shows further details of the slim USB device 274 to include a metal case metal case 208, a PCBA 210 and an end cap 212.

The metal case 208 is shown to have with a metal case front portion 222 and a metal case back portion 224. The metal case front portion 222 is shown to include a USB device tip 226 at a hollow end of the metal case front portion 222. The metal case back portion 224 is shown to include a USB device tabs 230 at the side of the metal case 208 and a USB device throughhole 231 through which a USB device Rivet is placed and maintained for use in pivoting the slim USB device. The USB device throughhole 231 is shown disposed on top of the metal case 208 at an end opposite to the USB device tip 226 and on either side of the USB device throughhole 231 is shown disposed a USB device protrusion 232 and a USB device protrusion 234 into which protrusions are snapped when the USB device is at a zero or 180 degree angle. The metal case back portion 224 is further shown to include a metal case slot 250 on its top and in a like-location on its bottom sides into which an end cap protrusion is snapped for holding the end cap 212 connected to the metal case 208. On either of its sides and substantially near the end of the metal case 208 farthest away from USB device tip 226 are two LED 252s into which end cap tabs are snapped for further helping to secure the end cap 212 to the metal case 208. At the end farthest away from the USB device tip 226, the metal case 208 is hollow, denoted by metal case hollow end 228 and this is the end into which PCBA 210 is inserted during manufacturing of the slim USB device 274.

The PCBA 210 is shown to include metal case 208 at one end and being disposed on top of a PCBA substrate 254. The metal case 208 are part of a USB connector that include a connector substrate 216 disposed in a raised position relative to the metal case 208 out of which extend 218, which are in contact with the PCBA substrate 254. In an exemplary embodiment, the connector substrate 216 is made of ceramic. The PCBA substrate 254, which extends the entire length of the PCBA 210 has further connected thereto a controller integrated circuit (IC) controller IC 220. A PCBA rivet throughhole 242 is disposed on an end of the PCBA 210 that is farthest from the metal case 208 and allows the rivet holding the slim USB device in place to go through.

The USB connector comprised of metal case 208 and connector substrate 216.

Optionally, an LED 252 is positioned on top of the PCBA substrate 254 for lighting the slim USB device 274 when the latter is operational, as in the case of the slim USB device 12.

The end cap 212 is shown to include a top end cap groove 246 similar to that of the slim USB device 12 and a end cap protrusion 244 disposed on top of the end cap 212 for snapping into the Metal case slot 250 and two end cap tabs 248 on either side for snapping into the LED 252s.

FIG. 19 shows a top side and a bottom side of the PCBA 210. The PCBA top side 211 is shown to include the connector substrate 216, the controller IC 220, the PCBA rivet throughhole 242 and the PCBA substrate 254, which are shown formed on the PCBA substrate 254. The PCBA bottom side 213 is shown to have disposed on its top side, the connector substrate stubs 204, a PCBA memory IC 256, the PCBA substrate 254 and the PCBA rivet throughhole 242. The PCBA memory IC 256 maintains information from the host, which is also accessible to the host under the direction of the controller IC 220. The PCBA memory IC 256 and the controller IC 220 are coupled to each other through the PCBA substrate 254. The connector substrate stubs 204 are clearly located on the bottom side of the USB connector, which has the metal case 208 and the connector substrate 216 located on its top side.

In an alternative embodiment, the connector substrate 216 of the PCBA 210 is replaced with a PCBA front portion and a COB, as will be further described relative to other embodiments of the slim USB device 274. It is understood that the dimensions of the PCBA 210 is designed in accordance with the structure, which houses the PCBA 210, such as the connector substrate 216 and the metal case 208.

FIG. 20 shows the step 258 performed for inserting the PCBA 210 into the metal case 208. The USB connector 207 comprises the front portion of PCBA 222 and the connector substrate 216.

In FIG. 20, the PCBA 210 is shown to have two printed circuit board (PCB) edges 260 disposed on either sides of PCBA 210, the start of which is defined by a corner 217. At step 258, the PCBA 210 is slid into the metal case 208 with the PCB edges 260s sliding through the USB device tabs 230 of the metal case 208 and the connector substrate 216 is accordingly inserted into the metal case front portion 222 of the metal case 208 until the connector substrate stubs 204 snap into the alignment cut-out 202 of the metal case 208.

The slim USB device 274 of FIG. 18 may be placed into a swivel cap, such as the swivel cap 38 with the other components of the USB drive 10 to make the slim USB device 274 pivotally connect to the swivel cap, in which case the swivel rocker of FIG. 1 is also employed. A detailed discussion of the foregoing is avoided due to redundancy. Once the USB device 274 is manufactured, the USB flash drive 200 is made using the same by adding the needed components and performing the steps recited with regard to the USB drive 10.

FIG. 21 shows parts of a USB flash drive 400, in accordance with yet another embodiment of the present invention. In FIG. 21, the USB flash drive 400 is shown to include a slim USB device 474 and a swivel rocker USB device opening 14 not shown.

Further shown in FIG. 21 are various components comprising the slim USB device 474. The slim USB device 474 is shown to include a plastic housing 468, generally rectangular in shape and hollow in the middle. On either side of the plastic housing 468 are optionally disposed fins 469 to prevent fingers gripping the plastic block 468 from slipping. The fins 469 is shown to include a housing throughhole 450 wherein the USB device Rivet 16 is place therethrough to establish a connection between the slim USB device 474 and swivel cap 38. The plastic housing 468 is further shown to include two edges 459 on either side and within the plastic housing 468 against which sheet metal USB head tabs align to secure a sheet metal USB head to the plastic housing 468. It should be noted that one side of the plastic housing 468 is uncovered until the cover 476 is placed thereon. The cover 476 includes the appropriate slots/throughholes for the requisite connections to facilitate the pivotal connection of the slim USB device and swivel cap. The cover 476 is a part of the slim USB device 474.

Further shown to be a part of the USB device 474 is a COB support 472, which functions in the same manner as the PCBA support and a COB 470 that is placed on top of the COB support 472. The COB 470 is shown to have disposed on a top surface thereof, contact fingers 481 for coupling the USB device 474 to a host. Optionally, on an end opposite to the end onto which the contact fingers 481 are formed, is positioned an LED 483 that lights up upon operation of the USB drive 400.

The USB device 474 is further shown to include a sheet metal USB head 462 that includes appropriate slots, such as those discussed relative to previous embodiments, and two sheet metal USB head tabs 464 and 466 extending out of the sheet metal USB head 462 on either side thereto for securing the sheet metal USB head 462 to the plastic housing 468 when the former is inserted into the latter. The sheet metal USB head 462 is molded to the plastic housing 468.

In an alternative embodiment of the present invention, the COB 470 is analogous to the PCBA 36 of FIG. 2 or to the PCBA 210 of the FIG. 19. As in the embodiment of FIG. 2, the COB 470 has dimensions corresponding to the structure in which it is housed.

FIG. 22 shows a COB top side 482 and a COB bottom side 484, in accordance with an embodiment of the present invention. The COB bottom side 484 is shown to have disposed on a top surface thereof, two stubs 406 that are and function similarly to the stubs 204. The COB top side 482 is shown to have two raised edges 473, each along one of its widths, and two COB support tabs 480 that are used to snap into corresponding sheet metal USB head slots 463 to secure the COB support 472 to the sheet metal USB head 462. The COB bottom side 484 similarly has associated tabs. The COB top side 482 is further shown to have a COB cut-out surface 478 forming the top surface thereof. The surface 478 is recessed or cut-out and not flat across the length of the COB top side 482 so as to house the COB 470.

FIG. 23(*a*) shows an angular perspective of the plastic housing 468 showing a side thereof that is opposite to that of the plastic housing's hollow or uncovered side and the fins 469. The plastic housing 468 is shown to have disposed on a side that is perpendicular to the side on which the fins 469 reside, a plastic housing cut-out 486 into which the COB housing is housed.

FIG. 23(*b*) shows an opposite side of the sheet metal USB head 462 to that which was shown in FIG. 21. The sheet metal USB head 462 is shown to have two alignment cut-out 402 dispersed on the surface in FIG. 23(*b*) that is and functions in a similar manner to the cut-out alignment cut-out 202.

FIG. 23(*c*) shows an un-covered slim USB device 494 including a housing molding structure 496 comprised of the plastic housing 468 and the sheet metal USB head 462 when the two are molded together. Along each of the sides, the plastic housing of the USB device 494 and therein are disposed plastic housing slots for coupling the cover 476 to the plastic housing 468.

In the foregoing embodiment as well as the previous embodiment, no end cap is needed because the plastic housing being molded to the sheet metal USB head substantially encapsulate and therefore secure the COB so as to make the slim USB device, which includes the COB, self-contained.

FIG. 24 shows a top and a bottom side of the cover 476, in accordance with an embodiment of the present invention. A cover top side 403 is shown to include a cover throughhole 402 disposed on the surface thereof and two cover protrusions 404 disposed on either side of the throughhole 402. The protrusions 404 serve to snap couple the USB device, in a manner such as described relative to the embodiment of FIG. 1. The throughhole 402 serves to allow the rivet to go through aiding in making the USB drive that includes the cover 476 to establish a pivotal connection with the USB device.

The cover bottom side 406 is shown to include a the throughhole 402 and four cover tabs 410, each disposed along a side of the cover bottom side 406 and positioned on each of the sides to snap the cover 476 into the plastic housing 468 by snapping the tabs 410 into corresponding slots 498.

FIGS. 25-27 show some of the steps performed in manufacturing the slim USB device 474, in accordance with methods of the present invention. In FIG. 25, at step 512, the COB 470 is dropped into the COB support 472. The structure formed after the completion of step 512 is referred to as COB support sub-assembly 471. In FIG. 26, at step 514, the COB support 472 is inserted into the 494 un-covered slim USB device 494 after the latter has been covered with the cover 476 (referred to as the "covered slim USB device"). The step 514 is performed by pressing the COB support sub-assembly 471 into the covered slim USB device until the tabs 418 of the sub-assembly 471 snap into the slots 416 and the stubs 406 snap into the cut-outs 402. The structure formed after the completion of step 514 is referred to as 501. At step 523, in FIG. 27, the cover 476 is pressed into the sub-assembly 471 until the tabs 410 of the cover 476 snap into the slots 498 of the plastic housing 468 thereby forming the slim USB device 474.

Figure 28:
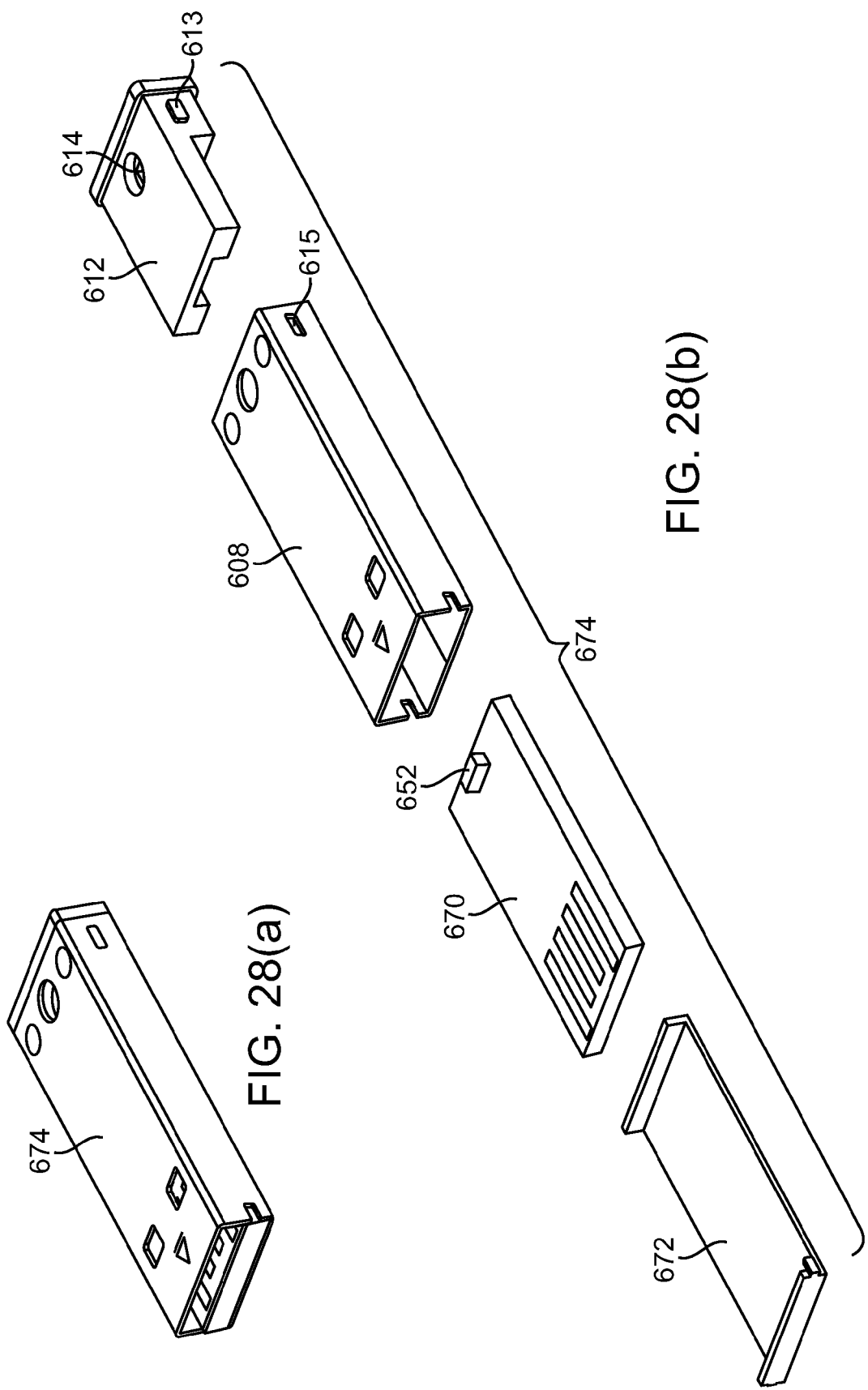

FIG. 28(*a*) shows top and side angular view of a slim USB device 674 in accordance with another embodiment of the present invention. FIG. 28(*b*) shows further details of the USB device 674 to include a COB support 672, a COB 670, which optionally includes an LED 652, a metal case 608 and an end cap 612 onto a top surface of which is disposed a USB device rivet throughhole 614. The COB 670 is placed onto the COB support 672 and the assembled unit is then placed into the metal case 608. Finally, the end cap 612 is inserted into the metal case 608 at an end that of the end cap 612 that is inapposite to the end into which the COB is placed. Two end cap tabs 613, disposed on either side of the end cap 612, snap into corresponding metal case slots 615 to secure the COB within the metal case. The USB device rivet throughhole 614 allows the rivet 16 to be placed therethrough so that the slim USB device 674 can pivot in and out of its swivel cap.

In an embodiment of the present invention, the COB 670 is analogous to the PCBA 36 or to the PCBA 210. As the PCBA 36, the COB 470 has dimensions corresponding to the structure in which it is housed.

FIG. 29 shows further details of a top and a bottom side of the COB support 672, in accordance with an embodiment of the present invention. A COB support top side 677 is shown to include a COB cut-out 678 generally forming a top surface of the COB support top side 677. The sides forming the width of the COB support top side 677 of the COB support 672 are shown raised to house the COB 670. The COB support top side 677 is shown to have disposed at two corners formed where the width and length of the COB support top side 677 meet, for snap coupling the COB support and the COB to the metal case 608.

A COB support bottom side 679 is shown to include four COB support stubs 606 disposed on the top surface of the COB support bottom side 679 for further snap coupling the COB support and COB to the metal case 608

FIG. 30 shows further details of the end cap 612, in accordance with an embodiment of the present invention. The end cap 612 is shown to include two COB end stops 616 formed as sides of the end cap but not rising in height to the highest height thereof. The stops 616 serve to stop the COB 670 from moving out of position once the end cap 612 is placed into the metal case 608. The stops 616 from steps on either side of the end cap so as to leave a void between them, namely a cut-out clearance 618 for housing an LED, if used. The end cap 612 is further shown to include two end cap tabs 648, formed on either side of the end cap beneath the surface thereof that has the throughhole 614 formed thereon. The tabs 648 snap couple the end cap 612 to the metal case 608 by snapping into the metal case slots 615 when the end cap is inserted into the metal case. The slim USB device 674 is used with a swivel cap to form a USB drive wherein the former pivotally extends in and out of the swivel cap.

Although the present invention has been described in terms of specific embodiment, it is anticipated that alterations and modifications thereof will no doubt become apparent to those more skilled in the art. It is therefore intended that the throughhole 614 and two following claims be interpreted as covering all such alterations and modification as fall within the true spirit and scope of the invention.

What is claimed is:

1. A Universal Serial Bus (USB) flash drive comprising:
   a slim USB device having an end used to couple the USB flash drive to a host when the USB flash drive is connected thereto, the slim USB device further having an opposite end;
   a printed circuit board assembly (PCBA) disposed within the slim USB device to maintain information provided by a host when the USB flash drive is connected to the host;
   a metal case into which the PCBA is housed, the metal case having disposed thereon a first USB device protrusion and a second USB device protrusion;
   a USB device swivel cap having a side slit that serves as an opening into which the slim USB device is encapsulated when the slim USB device is in a closed position, the side slit being disposed along a lateral side of the USB device swivel cap, the USB device swivel cap being the shape of the slim USB device and slightly larger than the slim USB device only to the extent that it encapsulates the slim USB device and no more the USB device swivel cap having disposed thereon a first cap hole and a second cap hole;
   a USB device rivet positioned in the slim USB device and the USB device swivel cap and configured to pivotally connect the USB device swivel cap to the slim USB device at the opposite end of the slim USB device to allow the slim USB device to pivotally extend outwardly from the side slit;
   a swivel rocker disposed at the opposite end of the slim USB device that is pivotally extendable outwardly from the opposite end of the slim USB device, the swivel rocker causing the slim USB device to extend outwardly through the side slit by establishing contact with the slim USB device and pushing it outwardly from the USB device swivel cap when the swivel rocker itself is caused to extend outwardly from the opposite end of the slim USB device thereby positioning the slim USB device in an open position, the first and second cap holes being disposed on either side of the USB device rivet, the first and second USB device protrusions being disposed on either side of the USB device rivet,
   wherein the first USB device protrusion fits into the first cap hole and the second USB device protrusion fits into the second cap hole to secure the metal case into the USB device swivel cap thereby causing the slim USB device to be locked into an open position when the first USB device protrusion fits into the first cap hole and the second USB device protrusion fits into the second cap hole.

2. A USB flash drive, as recited in claim 1, further including a swivel rocker protrusion disposed substantially in the middle of the swivel rocker to pivotally connect the swivel rocker to the USB device swivel cap.

3. A USB flash drive, as recited in claim 2, wherein the PCBA includes contact fingers formed on top of the PCBA at one end thereof to cause the USB flash drive to communicate with the host when the USB flash drive is connected to the host, the USB flash drive being connected to the host at an end of the USB device swivel cap where the contact fingers are positioned.

4. A USB flash drive, as recited in claim 3, wherein the slim USB device includes an end cap positioned at an end of the USB device swivel cap that is in opposite to the end that connects the USB flash drive to the host, the end cap securing the PCBA within the USB device swivel cap.

5. A USB flash drive, as recited in claim 4, wherein the metal case includes a set of USB device tabs disposed at either lateral sides of the USB device swivel cap to align the PCBA inside thereof.

6. A USB flash drive, as recited in claim 5, wherein the metal case includes a USB device tip at an end thereof within which the contact fingers reside and forms a USB connector adaptive to cause communication between the slim USB device and the host when the USB connector is connected to the host.

7. A USB flash drive, as recited in claim 6, wherein the metal case includes end slot, each disposed on the sides of the metal case at an end of the metal case into which the end cap is connected and the end cap includes end cap tabs disposed on either side of the end cap, each fitting into a corresponding end slot to secure the PCBA into the metal case.

8. A USB flash drive, as recited in claim 7, wherein the metal case includes a USB device throughhole disposed on the top surface of the metal case substantially at the end of the metal case into which the end cap is connected and extending through to a like location on the bottom surface of the metal case.

9. A USB flash drive, as recited in claim 8, wherein the metal case includes a first USB device protrusion disposed on one side of the USB device throughhole and a second USB device protrusion disposed on the other side of the USB device throughhole and a second USB device protrusion disposed on the other side of the USB device throughhole, each of the first USB device protrusion and the second USB device protrusion extending through to a like location on the bottom surface of the metal case.

10. A USB flash drive, as recited in claim 9, wherein the USB device swivel cap includes a cap rivet hole that is disposed on the top surface of the swivel cap and extends through to a like location on the bottom surface of the USB device swivel cap.

11. A USB flash drive, as recited in claim 10, wherein the USB device swivel cap includes a first cap hole and disposed on one side of the cap rivet hole and a second cap hole disposed on the other side of the cap rivet hole, each of the first USB device protrusion and second USB device protrusion extends through to a like and corresponding location on the bottom surface of the USB device swivel cap, wherein the first USB device protrusion is snapped into the cap hole and the second USB device protrusion is snapped into the second cap hole to connect the USB device swivel cap with the metal cap.

12. A USB flash drive, as recited in claim 11, wherein the cap rivet hole and the first USB device protrusion are aligned.

13. A USB flash drive, as recited in claim 11, further including a label disposed on the top surface of the USB device swivel cap.

14. A USB flash drive, as recited in claim 13, further including a PCBA support onto which the PCBA sits within the metal case to maintain the PCBA therein.

15. A USB flash drive, as recited in claim 14, wherein the PCBA includes a top surface and a bottom surface and the top surface includes a light emitting diode (LED) that lights when the USB flash drive in operation.

16. A USB flash drive, as recited in claim 15, wherein the top surface of the PCBA has formed thereon, the contact fingers and includes a memory integrated circuit caused to store information from the host.

17. A USB flash drive, as recited in claim 16, wherein the bottom surface of the PCBA includes a controller integrated circuit that is in communication with the host to store information from the host into the memory integrated circuit.

18. A USB flash drive, as recited in claim 17, wherein the PCBA has disposed at an end thereof a PCBA rivet through-hole through which the USB device rivet is placed.

19. A USB flash drive, as recited in claim 18, wherein the end cap has disposed on the top thereof end cap protrusion and the metal case has disposed on the top thereof at the end of the metal case into which the end cap is connected, a metal case slot, the end cap protrusion being positioned into the metal case slot when the end cap is connected to the metal case.

20. A USB flash drive, as recited in claim 1, wherein the USB flash drive is removably connected to a host and further includes a printed circuit board assembly (PCBA) disposed, on a connector substrate, within the slim USB device, to maintain information provided by the host when the USB flash drive is connected to the host.

* * * * *